(12) United States Patent
Nakajima

(10) Patent No.: US 12,463,131 B2
(45) Date of Patent: Nov. 4, 2025

(54) INTERCONNECT SUBSTRATE WITH LAYERS CONSTITUTING STRIPLINE AND SEMICONDUCTOR APPARATUS

(71) Applicant: SHINKO ELECTRIC INDUSTRIES CO., LTD., Nagano (JP)

(72) Inventor: Takashi Nakajima, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 18/048,996

(22) Filed: Oct. 24, 2022

(65) Prior Publication Data

US 2023/0135774 A1 May 4, 2023

(30) Foreign Application Priority Data

Nov. 2, 2021 (JP) ................................. 2021-179520

(51) Int. Cl.
*H01L 23/522* (2006.01)
*H01L 23/482* (2006.01)
*H01L 23/528* (2006.01)
*H01L 23/64* (2006.01)

(52) U.S. Cl.
CPC ........ *H01L 23/5226* (2013.01); *H01L 23/482* (2013.01); *H01L 23/528* (2013.01); *H01L 23/64* (2013.01)

(58) Field of Classification Search
CPC .... H01L 23/5226; H01L 23/528; H01L 23/64
See application file for complete search history.

(56) References Cited

U.S. PATENT DOCUMENTS

| 9,245,835 B1 * | 1/2016 | Jiang ................. H01L 23/49816 |
| 2007/0120231 A1 | 5/2007 | Kobayashi et al. |
| 2013/0075140 A1 * | 3/2013 | Amano ................ H05K 3/4602 174/257 |

(Continued)

FOREIGN PATENT DOCUMENTS

| JP | 2004-031530 | 1/2004 |
| JP | 2006-019108 | 1/2006 |

(Continued)

OTHER PUBLICATIONS

Office Action mailed on Feb. 12, 2025 with respect to the corresponding Japanese patent application No. 2021-179520.

*Primary Examiner* — Lex H Malsawma
*Assistant Examiner* — Bruce R. Smith
(74) *Attorney, Agent, or Firm* — IPUSA, PLLC

(57) ABSTRACT

An interconnect substrate includes a first interconnect layer, a first insulating layer covering a side surface and a lower surface of the first interconnect layer, a second insulating layer disposed on the first insulating layer and covering an upper surface of the first interconnect layer, a second interconnect layer formed on a lower surface of the first insulating layer, and a third interconnect layer formed on an upper surface of the second insulating layer, wherein the second interconnect layer includes a first ground plane, wherein the third interconnect layer includes a second ground plane, and wherein the first ground plane, the first insulating layer, the first interconnect layer, the second insulating layer, and the second ground plane constitute a stripline.

8 Claims, 16 Drawing Sheets

(56) References Cited

U.S. PATENT DOCUMENTS

| | | | | |
|---|---|---|---|---|
| 2014/0076614 A1* | 3/2014 | Kobayashi | ........... | H05K 1/0298 |
| | | | | 174/251 |
| 2016/0088727 A1* | 3/2016 | Furutani | .............. | H05K 3/4673 |
| | | | | 174/262 |
| 2020/0389969 A1* | 12/2020 | Ikeda | ..................... | H05K 1/025 |

FOREIGN PATENT DOCUMENTS

| JP | 2014-063801 | | 4/2014 |
|---|---|---|---|
| JP | 2021077680 A | * | 5/2021 |

* cited by examiner

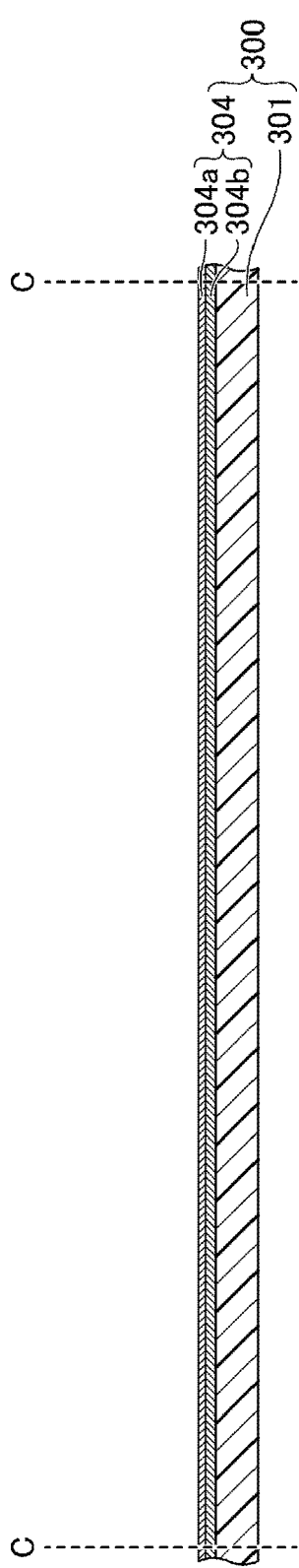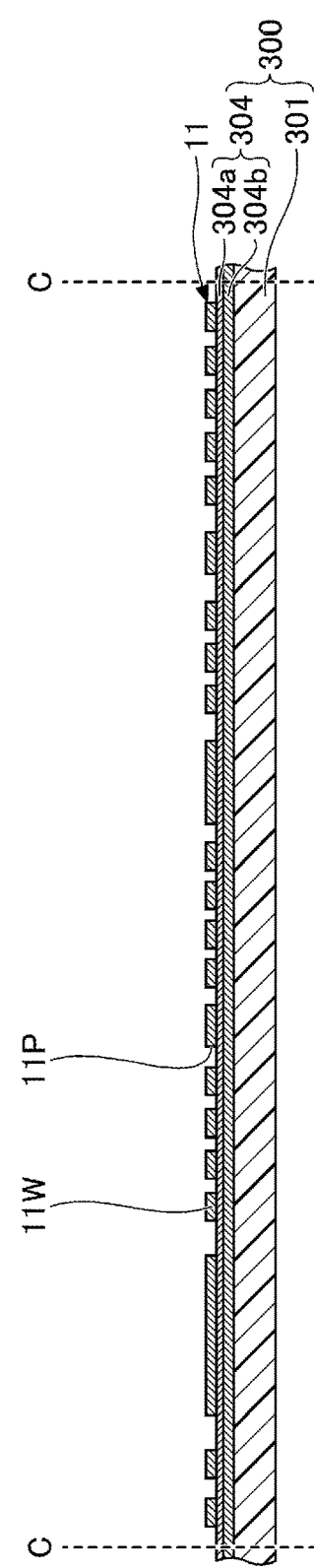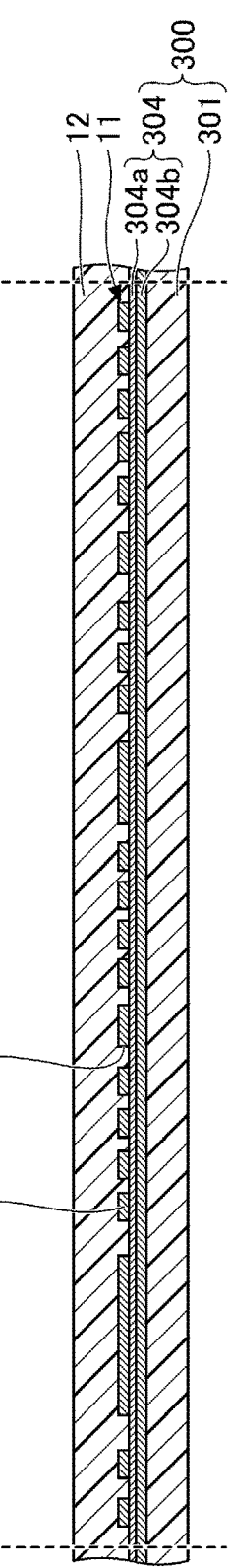

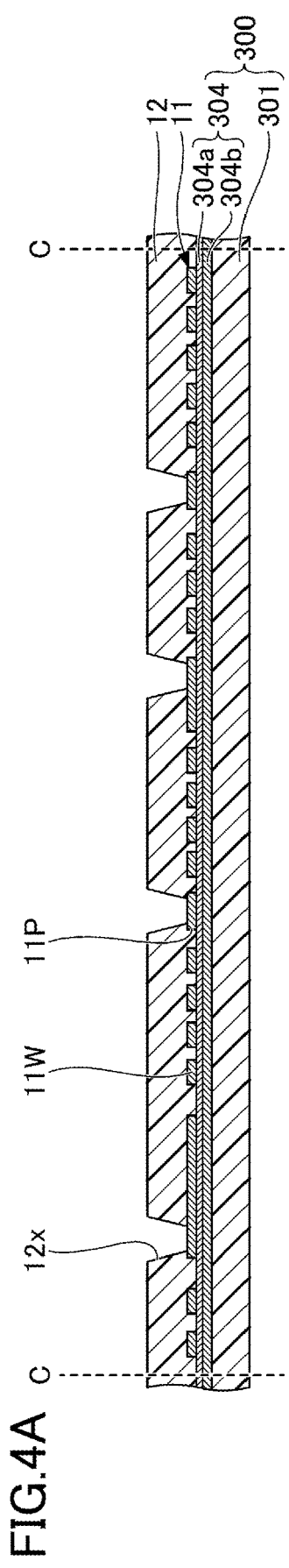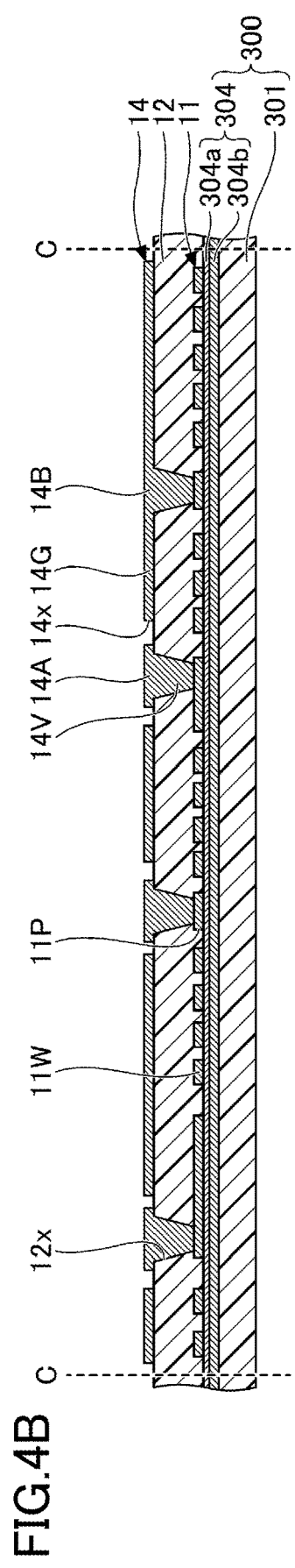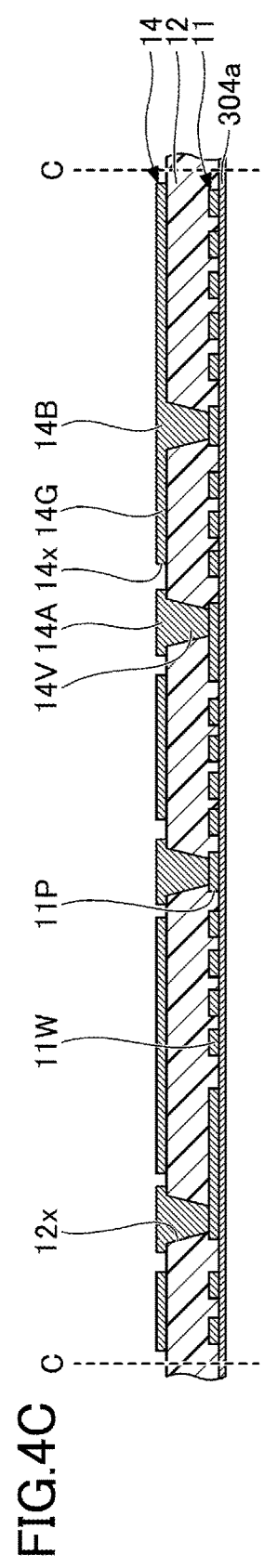

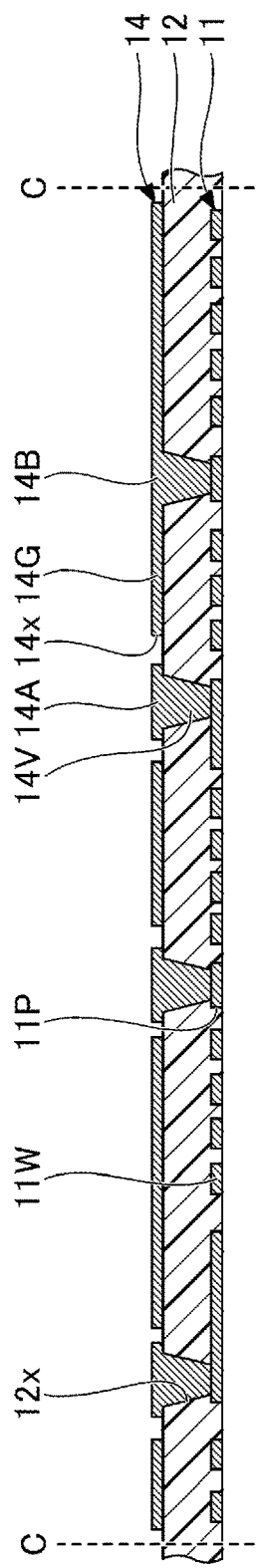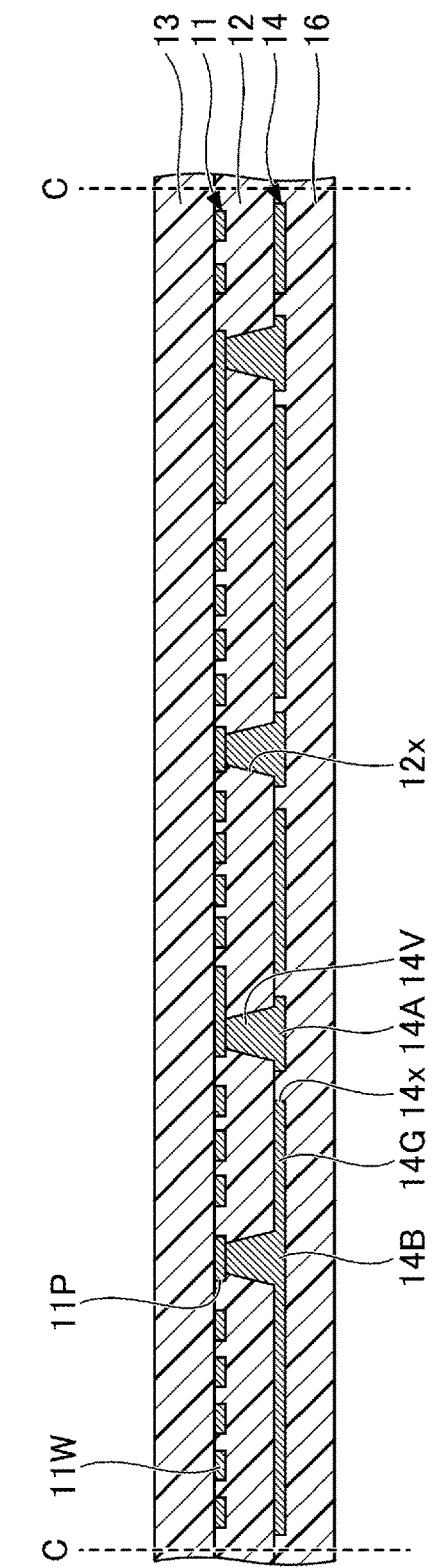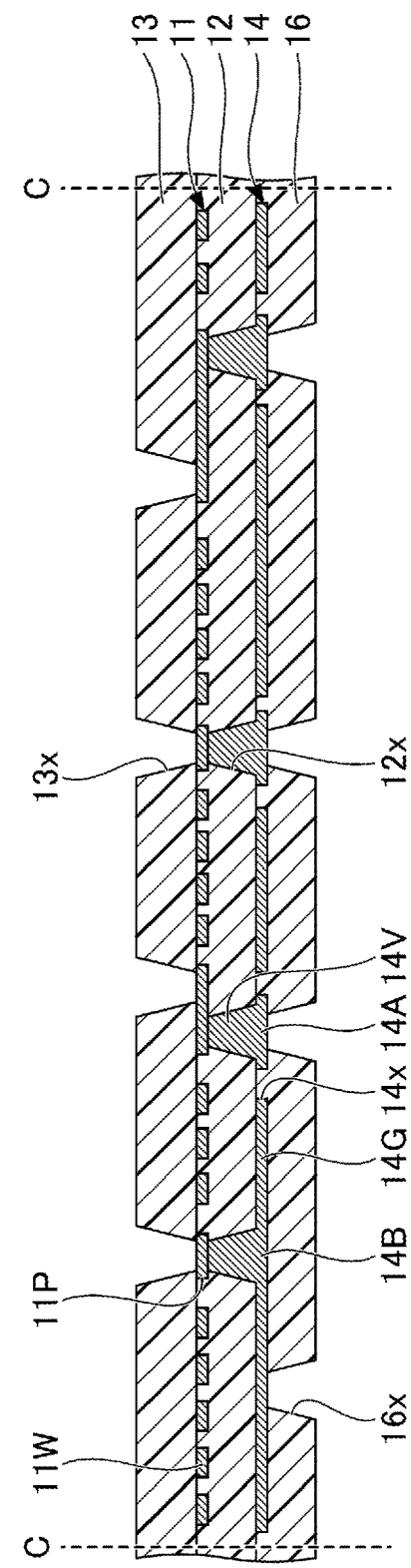

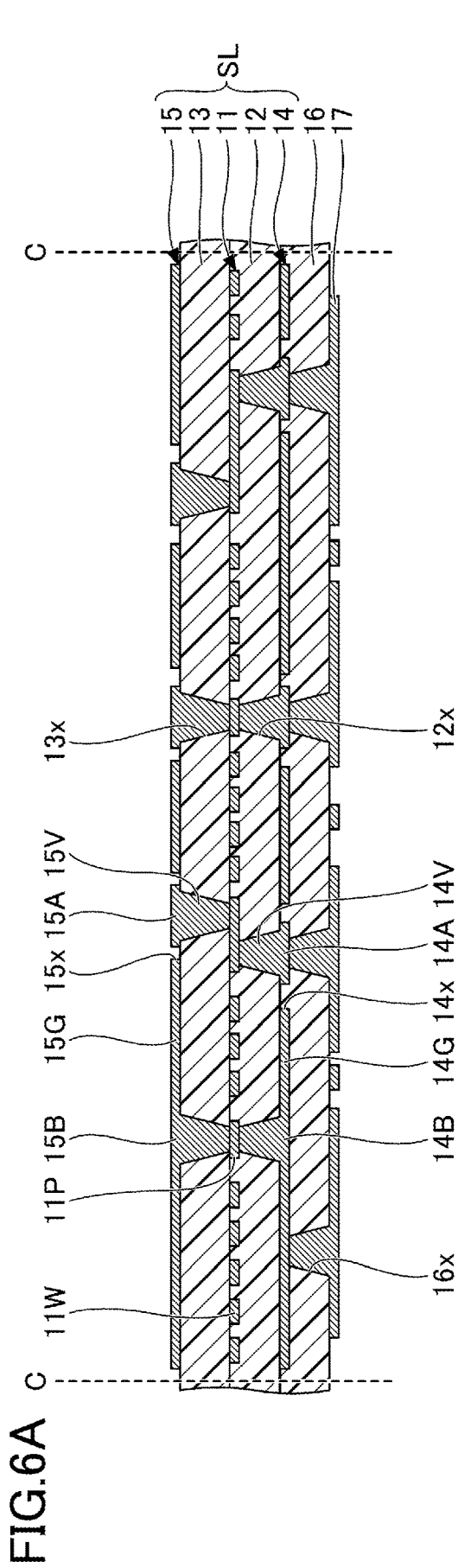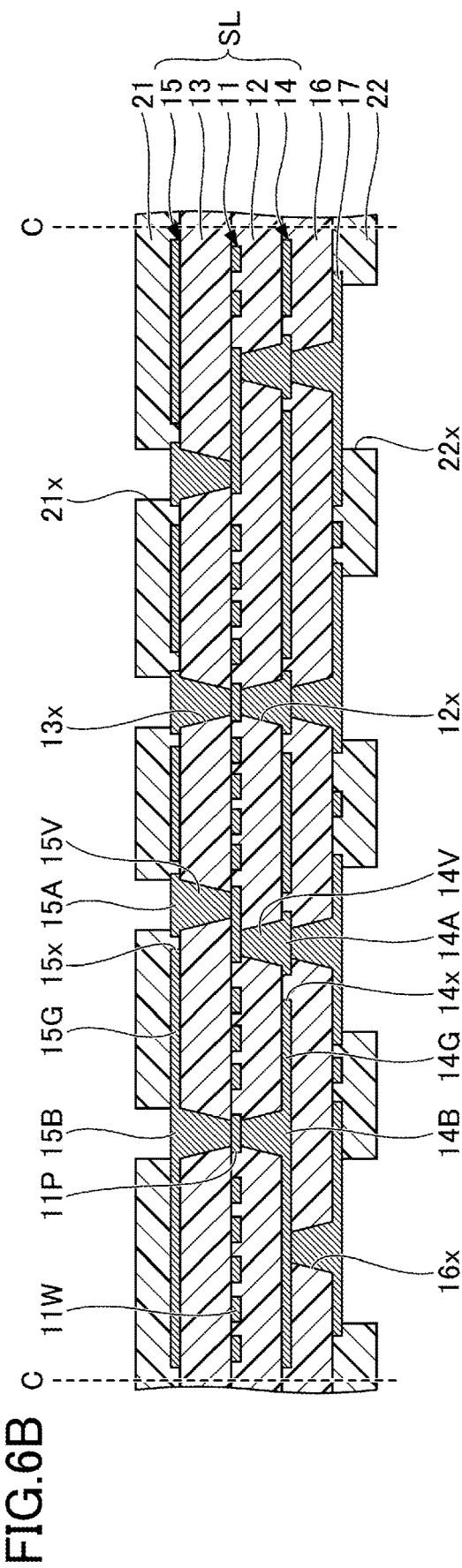

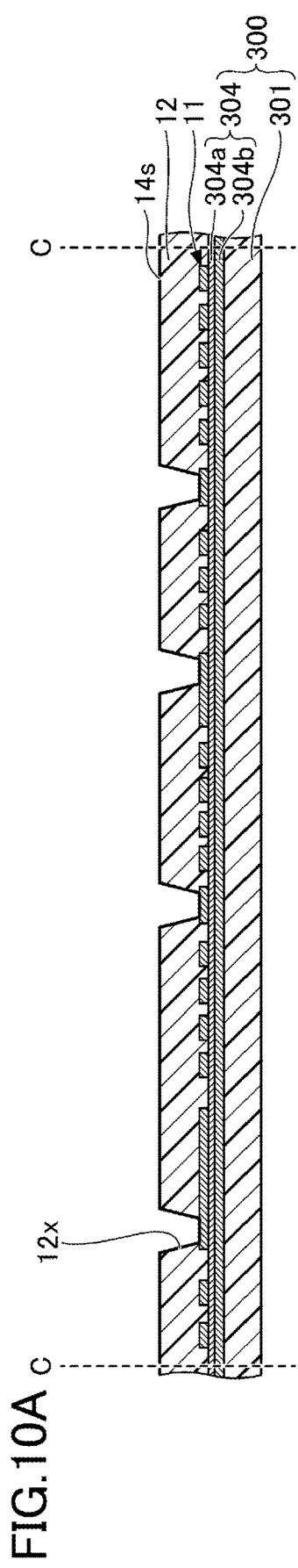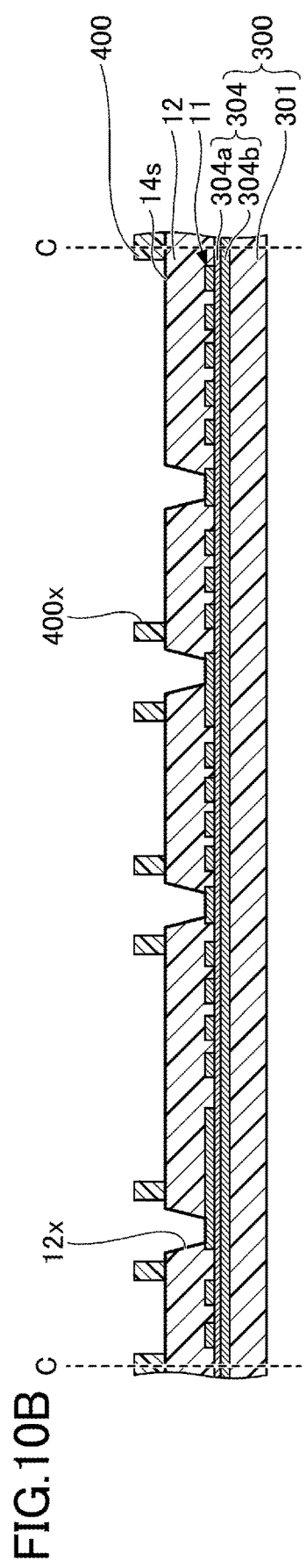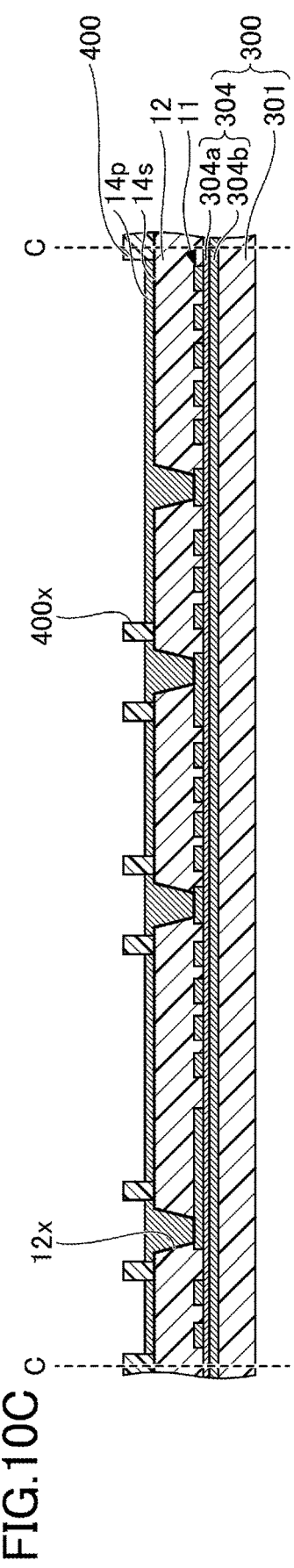

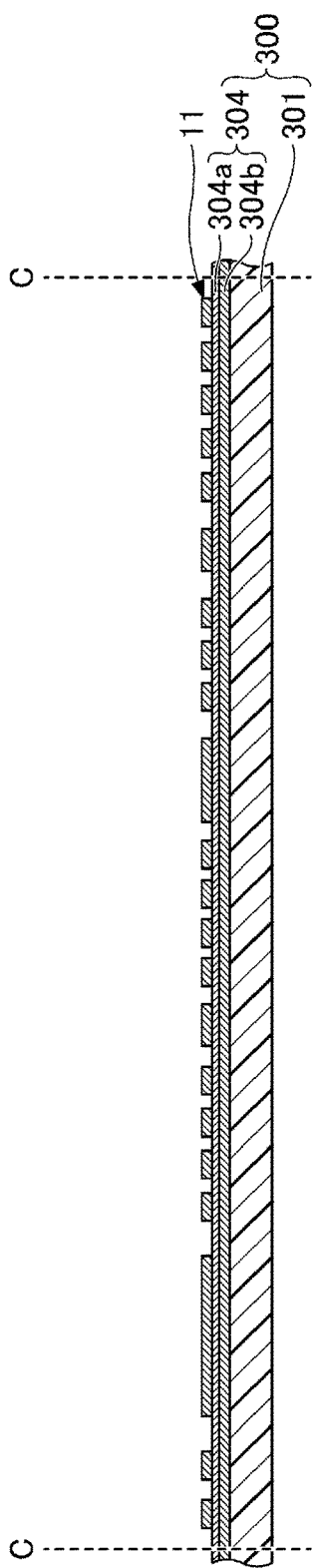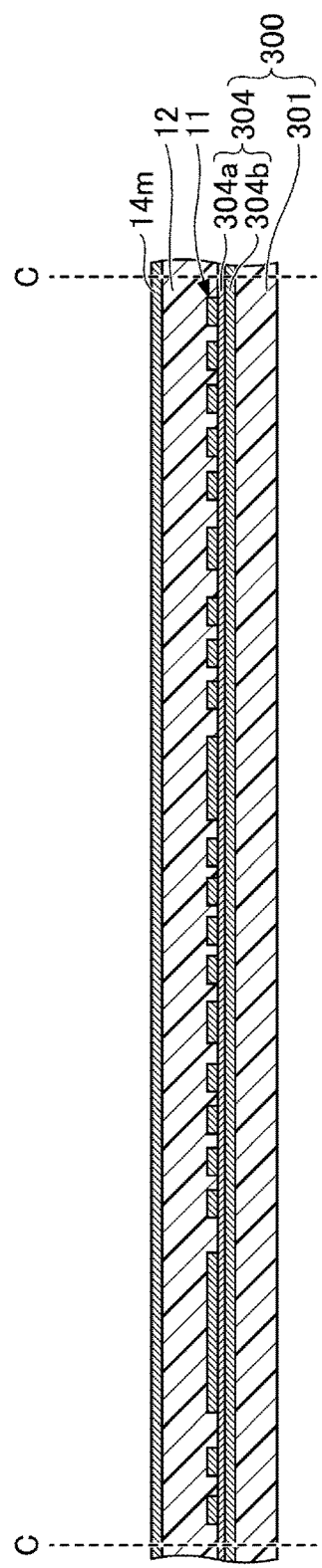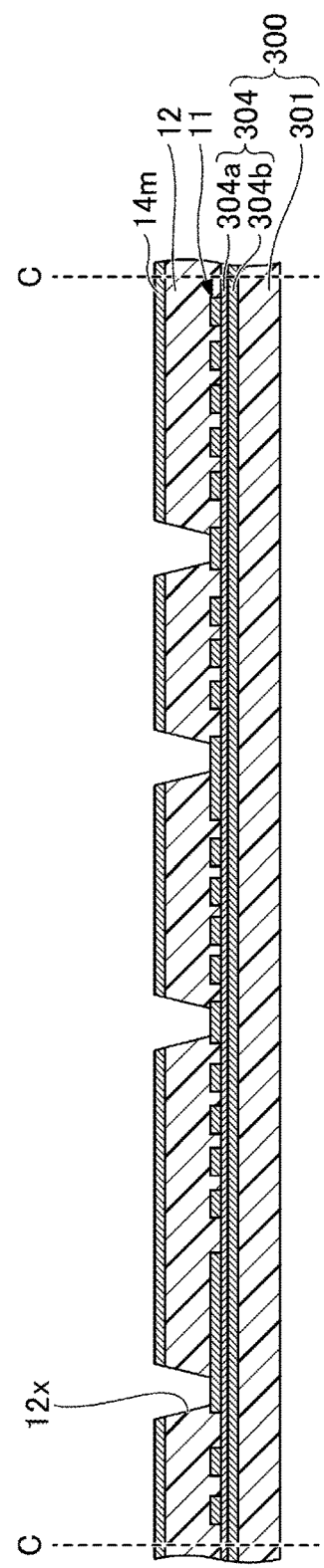

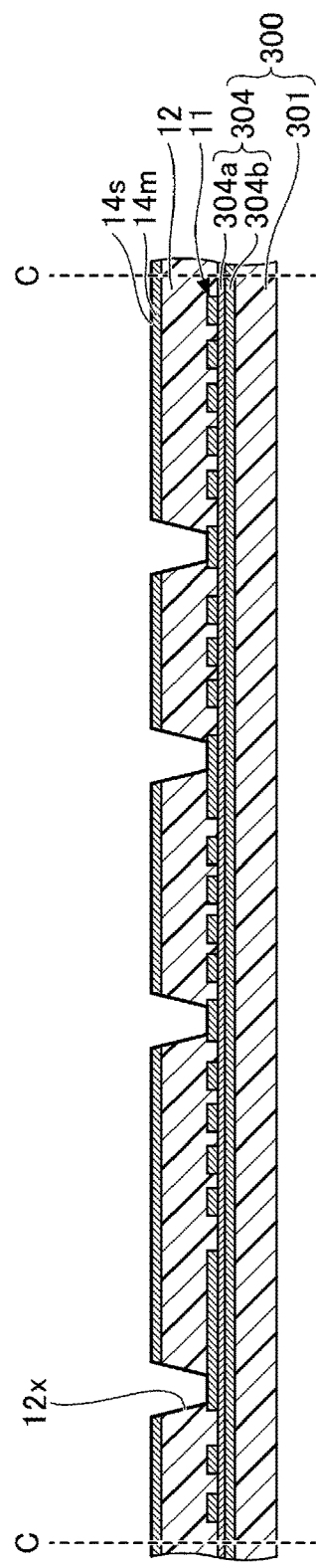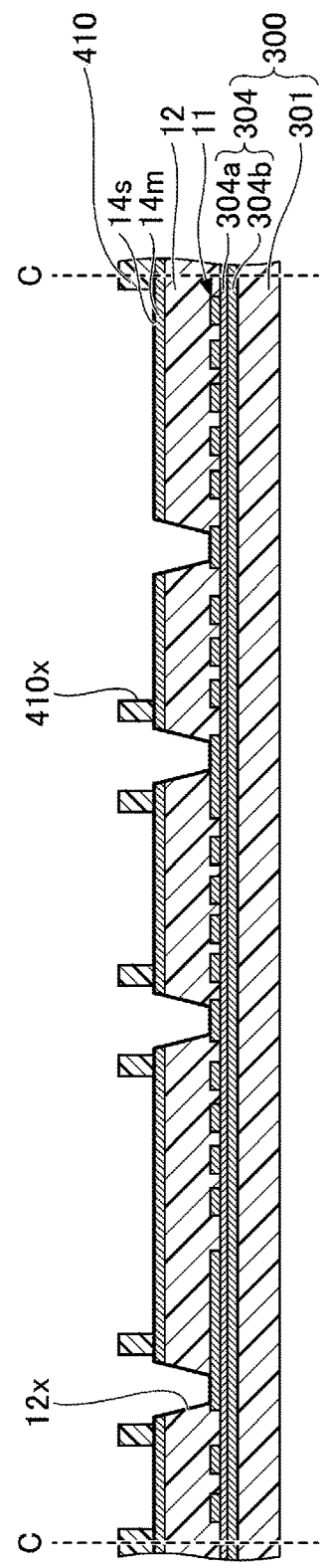

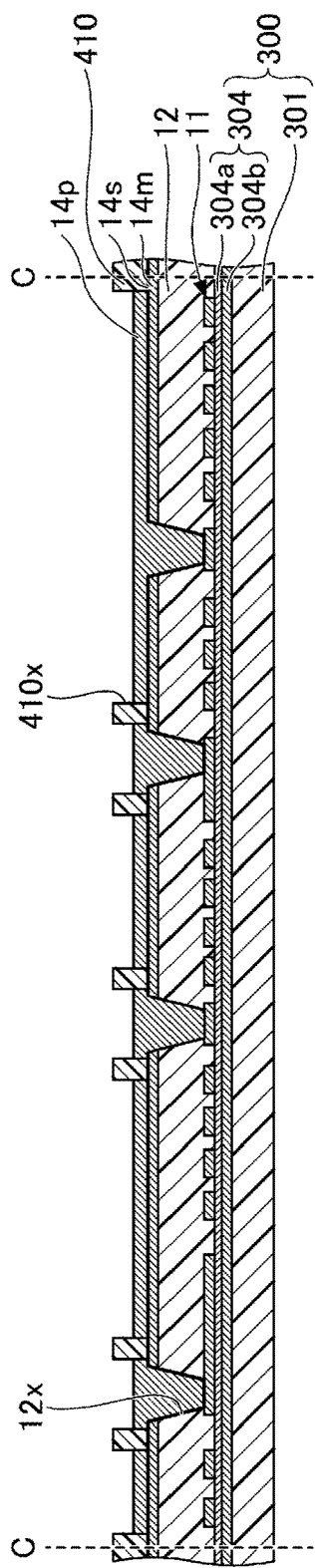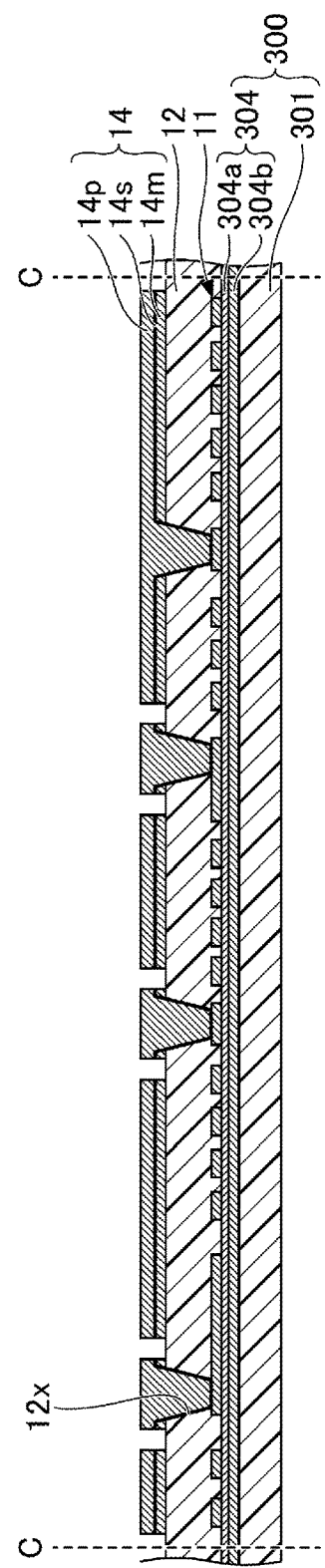

INTERCONNECT SUBSTRATE WITH LAYERS CONSTITUTING STRIPLINE AND SEMICONDUCTOR APPARATUS

CROSS-REFERENCE TO RELATED APPLICATIONS

The present application is based on and claims priority to Japanese Patent Application No. 2021-179520 filed on Nov. 2, 2021, with the Japanese Patent Office, the entire contents of which are incorporated herein by reference.

FIELD

The disclosures herein relate to interconnect substrates, methods of making the same, and semiconductor apparatuses.

BACKGROUND

An interconnect substrate for mounting a semiconductor chip as known in the art constitutes part of a semiconductor apparatus on which the semiconductor chip is mounted (see, for example, Patent Document 1). When the semiconductor chip is designed to handle radio-frequency signals, a microstrip line or a stripline may be provided on the interconnect substrate in order to control the characteristic impedance.

The line width and space of the interconnect pattern constituting a stripline can be made smaller than the line width and space of the interconnect pattern constituting a microstrip line having the same characteristic impedance. Use of a stripline thus enables the increase of interconnect density in an interconnect substrate.

Reducing the line width and space of the interconnect pattern constituting a stripline ends up lowering the adhesion strength between the interconnect pattern and insulating layers. There is thus a risk that the interconnect pattern may be disconnected from the insulating layers.

Accordingly, it may be preferable to improve adhesion between an interconnect pattern constituting a stripline and insulating layers in an interconnect substrate having the stripline.

PRIOR ART DOCUMENT

[Patent Document 1] Japanese Laid-Open Patent Publication No. 2014-063801

SUMMARY

According to an aspect of the embodiment, an interconnect substrate includes a first interconnect layer, a first insulating layer covering a side surface and a lower surface of the first interconnect layer, a second insulating layer disposed on the first insulating layer and covering an upper surface of the first interconnect layer, a second interconnect layer formed on a lower surface of the first insulating layer, and a third interconnect layer formed on an upper surface of the second insulating layer, wherein the second interconnect layer includes a first ground plane, wherein the third interconnect layer includes a second ground plane, and wherein the first ground plane, the first insulating layer, the first interconnect layer, the second insulating layer, and the second ground plane constitute a stripline.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIGS. 3A through 3C are drawings illustrating an example of a method of making the interconnect substrate of the first embodiment;

FIGS. 4A through 4C are drawings illustrating the example of the method of making the interconnect substrate of the first embodiment;

FIGS. 5A through 5C are drawings illustrating the example of the method of making the interconnect substrate of the first embodiment;

FIGS. 6A and 6B are drawings illustrating the example of the method of making the interconnect substrate of the first embodiment;

FIGS. 10A through 10C are drawings illustrating an example of a detailed method of forming an interconnect layer;

FIGS. 12A through 12C are drawings illustrating a further example of the detailed method of forming an interconnect layer;

FIGS. 13A and 13B are drawings illustrating the further example of the detailed method of forming an interconnect layer;

FIGS. 14A and 14B are drawings illustrating the further example of the detailed method of forming an interconnect layer;

DESCRIPTION OF EMBODIMENTS

Figure 1:
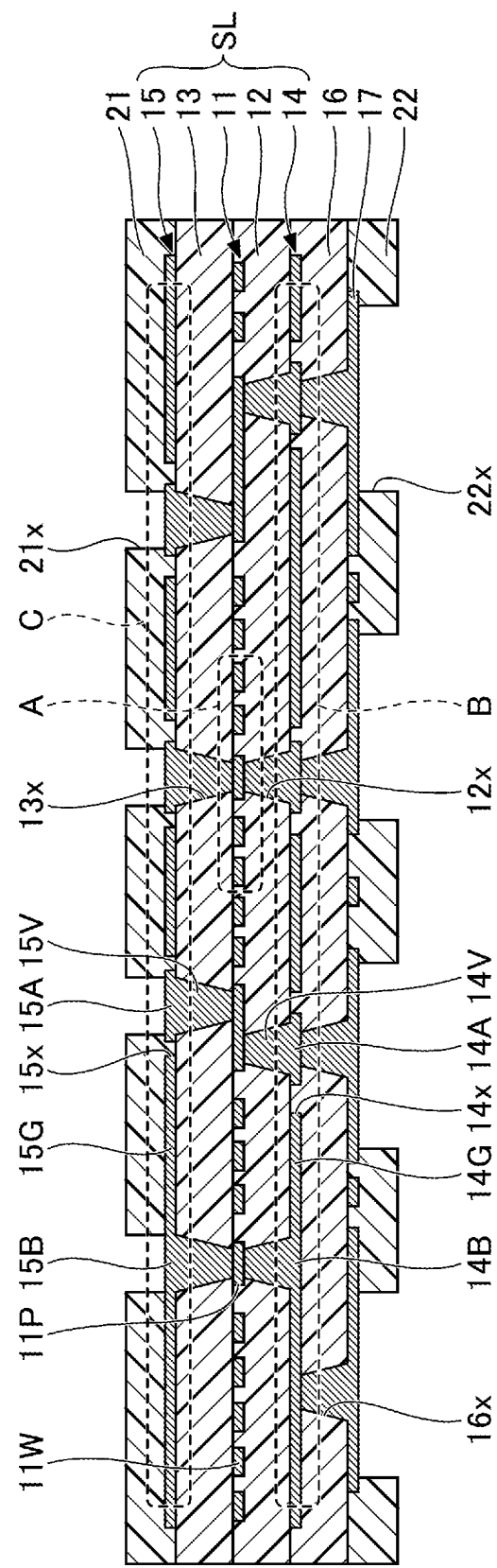
FIG. 1 is a cross-sectional view illustrating an example of an interconnect substrate according to a first embodiment.

In the following, embodiments of the present invention will be described with reference to the accompanying drawings. In the drawings, the same components are referred to by the same reference numerals, and a duplicate description thereof may be omitted.

First Embodiment

[Structure of Interconnect Substrate]
FIG. 1 is a cross-sectional view illustrating an example of an interconnect substrate according to a first embodiment.

Figure 2A:
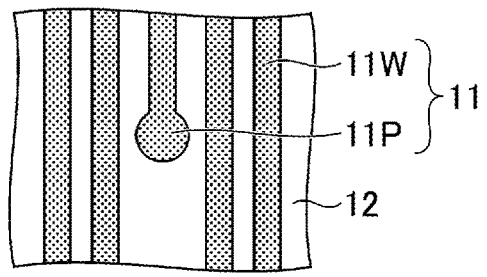
FIGS. 2A through 2C are partial plan views illustrating the interconnect substrate according to the first embodiment.
Figure 2B:
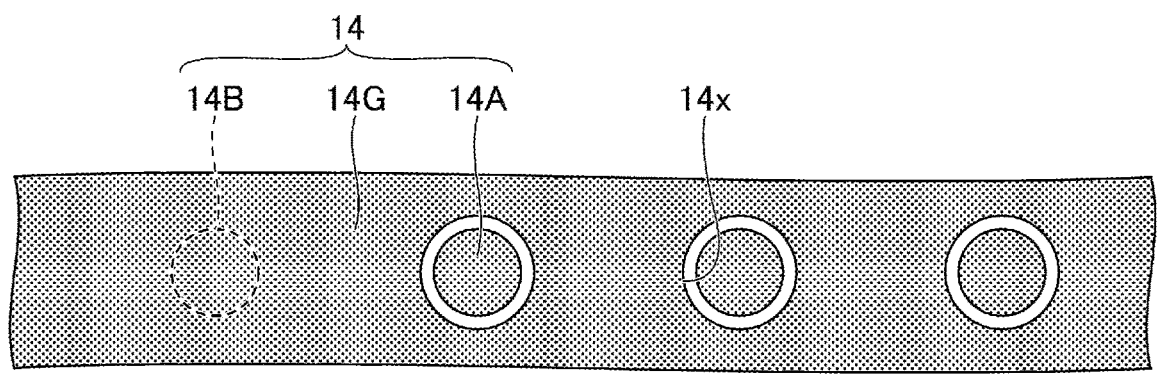
Figure 2C:
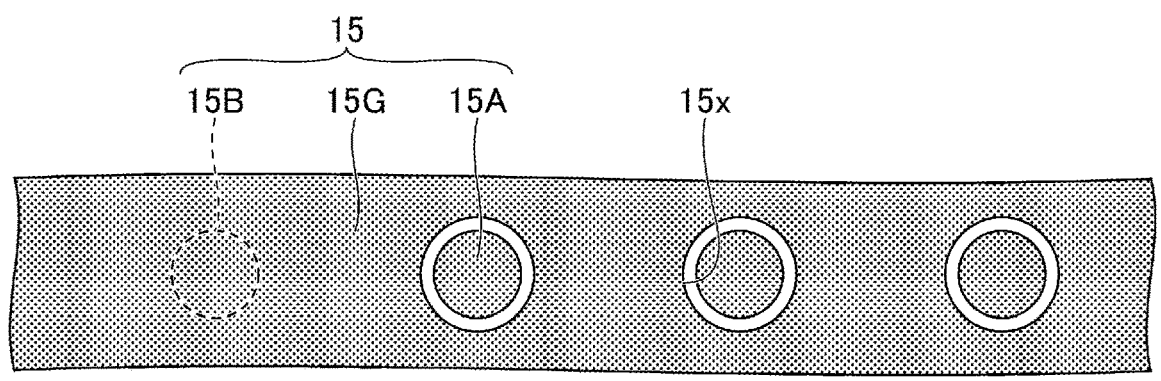

FIGS. 2A through 2C are partial plan views illustrating the interconnect substrate according to the first embodiment. Specifically, FIG. 2A is a partial plan view of the portion A in FIG. 1 viewed from the upper surface side of a first interconnect layer 11. FIG. 2B is a partial plan view of the portion B in FIG. 1 viewed from the lower surface side of a second interconnect layer 14. FIG. 2C is a partial plan view of the portion C in FIG. 1 viewed from the upper surface side of a third interconnect layer 15.

Referring to FIG. 1, the interconnect substrate 1 includes a first interconnect layer 11, a first insulating layer 12, a second insulating layer 13, a second interconnect layer 14, a third interconnect layer 15, a third insulating layer 16, a fourth interconnect layer 17, a solder resist layer 21, and a solder resist layer 22.

In the present embodiment, for the sake of convenience, the side of the interconnect substrate 1 on which the solder resist layer 21 is situated in FIG. 1 is referred to as an upper side or a first side, and the side on which the solder resist layer 22 is situated is referred to as a lower side or a second side. A surface (or face) of a given member that faces toward the upper side is referred to as a first surface (or first face) or an upper surface (or upper face), and a surface (or face) of the given member that faces toward the lower side is referred to as a second surface (or second face) or a lower surface (or lower face). It may be noted, however, that the interconnect substrate 1 may be used in an upside-down position, or may be placed at any angle. Further, a plan view refers to a view taken in the direction perpendicular to the first surface of the solder resist layer 21, and a plane shape refers to the shape of an object as viewed in the direction perpendicular to the first surface of the solder resist layer 21. When the interconnect substrate 1 is illustrated upside down relative to FIG. 1, the definition of the upper surface and the lower surface becomes opposite to the above-noted definition in accordance with the orientation of what is illustrated in the drawing.

The first interconnect layer 11 includes a plurality of interconnect patterns 11W and a plurality of pads 11P. The plane shape of the pads 11P is, for example, a circle having a diameter of about 60 μm to 120 μm. Within this noted range, any diameter of the pads 11P is smaller than the diameter of first signal pads 14A and the diameter of second signal pads 15A, which will be described later. Cu or the like, for example, may be used as the material of the interconnect patterns 11W and the pads 11P. The interconnect patterns 11W and the pads 11P may have a laminated structure comprised of a plurality of metal layers. The thicknesses of the interconnect patterns 11W and the pads 11P may be, for example, about 10 to 30 μm.

The first interconnect layer 11 has the highest density among the interconnect patterns of the interconnect substrate 1. In other words, the minimum interval between adjacent interconnect patterns 11W in the first interconnect layer 11 is narrower than the minimum interval between adjacent interconnect patterns in the other interconnect layers. The line width and space of the interconnect patterns 11W may approximately be a line width of 8 to 10 μm and a space of 8 to 10 μm, for example. The line width represents the width of an interconnect line, and the space represents an interval between adjacent interconnect lines (i.e., interconnect interval). The notation "a line width of 8 μm and a space of 10 μm" represents that the width of an interconnect line is 8 μm and the interval between adjacent interconnect lines is 10 μm.

The first insulating layer 12 is formed so as to cover the side surface and the lower surface of the first interconnect layer 11. The upper surface of the first insulating layer 12 may be flush with the upper surface of the first interconnect layer 11, for example. The material of the first insulating layer 12 may be, for example, an insulating resin containing an epoxy-based resin or a polyimide-based resin as a main component. The thickness of the first insulating layer 12 may be, for example, about 20 to 30 μm. Here, the thickness of the first insulating layer 12 is a distance from the lower surface of the first interconnect layer 11 to the lower surface of the first insulating layer 12. The same applies to the thicknesses of other insulating layers and the like. The first insulating layer 12 may contain a filler such as silica ($SiO_2$). The content of the filler in the first insulating layer 12 may be appropriately set according to the required coefficient of thermal expansion (CTE).

The second insulating layer 13 that covers the upper surface of the first interconnect layer 11 is laminated on the upper surface of the first insulating layer 12. The material and thickness of the second insulating layer 13 may be, for example, substantially the same as those of the first insulating layer 12. The second insulating layer 13 can contain a filler such as silica ($SiO_2$). The content of the filler in the second insulating layer 13 may be, for example, substantially the same as that in the first insulating layer 12.

The second interconnect layer 14 is formed on the lower surface of the first insulating layer 12. The second interconnect layer 14 includes a first ground plane 14G, first signal pads 14A, a first ground pad 14B, and via interconnects 14V. The first ground plane 14G is formed in a substantially solid shape so as to cover most of the lower surface of the first insulating layer 12. The first signal pads 14A are disposed in openings 14x provided in the first ground plane 14G. The plane shape of the first signal pads 14A is, for example, a circle having a diameter of about 80 μm to 200 μm. The first ground pad 14B forms part of the first ground plane 14G.

Each of the first signal pads 14A and the first ground pad 14B is formed integrally with a corresponding one of the via interconnects 14V filling the via holes 12x that extend through the first insulating layer 12 and expose the lower surface of the first interconnect layer 11. The via holes 12x may be a truncated cone-shaped recess, with the size of the opening thereof on the third insulating layer 16 side being larger than the size of the bottom surface thereof formed by the lower surface of the pads 11P. In this case, the area of the portion of each via interconnect 14V connected to the lower surface of the pads 11P is smaller than the area of the portion of each via interconnect 14V connected to the upper surface of the first signal pads 14A or the first ground pad 14B.

The plurality of pads 11P include pads 11P electrically connected to the first signal pads 14A through the respective via interconnects 14V extending through the first insulating layer 12, and also include a pad 11P electrically connected to the first ground pad 14B through a corresponding one of the via interconnects 14V extending through the first insulating layer 12. The material of the second interconnect layer 14 and the thickness of the ground plane and the pads may be substantially the same as those of the first interconnect layer 11, for example.

The third interconnect layer 15 is formed on the upper surface of the second insulating layer 13. The third interconnect layer 15 includes a second ground plane 15G, second signal pads 15A, a second ground pad 15B, and via interconnects 15V. The second ground plane 15G is formed in a substantially solid shape so as to cover most of the upper surface of the second insulating layer 13. The second signal pads 15A are disposed in openings 15x provided in the second ground plane 15G. The plane shape of the second signal pads 15A is, for example, a circle having a diameter of about 80 µm to 200 µm. The second ground pad 15B forms part of the second ground plane 15G.

Each of the second signal pads 15A and the second ground pad 15B is formed integrally with a corresponding one of the via interconnects 15V filling the via holes 13x that extend through the second insulating layer 13 and expose the upper surface of the first interconnect layer 11. The via holes 13x may be an inverted truncated cone-shaped recess, with the size of the opening thereof on the solder resist layer 21 side being larger than the size of the bottom surface thereof formed by the upper surface of the pads 11P. In this case, the area of the portion of each via interconnect 15V connected to the upper surface of the pads 11P is smaller than the area of the portion of each via interconnect 15V connected to the lower surface of the second signal pads 15A or the second ground pad 15B.

The plurality of pads 11P include pads 11P electrically connected to the second signal pads 15A through the respective via interconnects 15V extending through the second insulating layer 13, and include a pad 11P electrically connected to the second ground pad 15B through a corresponding one of the via interconnects 15V extending through the second insulating layer 13. The material of the third interconnect layer 15 and the thickness of the ground plane and the pads may be substantially the same as those of the first interconnect layer 11, for example.

The third insulating layer 16 is formed on the lower surface of the first insulating layer 12 so as to cover the second interconnect layer 14. The material and thickness of the third insulating layer 16 may be, for example, substantially the same as those of the first insulating layer 12. The third insulating layer 16 may contain a filler such as silica ($SiO_2$). The content of the filler in the third insulating layer 16 may be, for example, substantially the same as that in the first insulating layer 12.

The fourth interconnect layer 17 is formed on the second side of the third insulating layer 16. The fourth interconnect layer 17 includes via interconnects filling via holes 16x extending through the third insulating layer 16 and exposing the lower surface of the second interconnect layer 14, pads formed on the lower surface of the third insulating layer 16, and interconnect patterns. The pads constituting the fourth interconnect layer 17 are electrically connected to the first signal pads 14A or the first ground pad 14B through the via interconnects. The via holes 16x may be a truncated cone-shaped recess, with the size of the opening thereof on the solder resist layer 22 side being larger than the size of the bottom surface thereof formed by the lower surface of the first signal pads 14A or the first ground pad 14B. The material of the fourth interconnect layer 17 and the thickness of the pads and the interconnect patterns may be substantially the same as those of the first interconnect layer 11, for example.

The solder resist layer 21 is an outermost layer on the first side of the interconnect substrate 1, and is formed on the upper surface of the second insulating layer 13 so as to cover the third interconnect layer 15. The solder resist layer 21 may be formed of, for example, a photosensitive resin such as an epoxy-based resin or an acrylic-based resin. The thickness of the solder resist layer 21 may be, for example, about 15 to 35 µm.

The solder resist layer 21 has openings 21x. Part of the upper surface of the second signal pads 15A or the second ground pad 15B constituting the third interconnect layer 15 is exposed at the bottom of the openings 21x. The plane shape of the openings 21x may be, for example, a circle. The second signal pads 15A and the second ground pad 15B of the third interconnect layer 15 exposed in the openings 21x may be used for electrical connection with a semiconductor chip. That is, the solder resist layer 21 side is the side on which a semiconductor chip is mounted.

If necessary, a metal layer may be formed, or an anti-oxidation treatment such as an organic solderability preservative (i.e., OSP) treatment may be performed, on the upper surface of the second signal pads 15A or the second ground pad 15B exposed in the openings 21x. Examples of the metal layer include an Au layer, an Ni/Au layer (i.e., a metal layer in which an Ni layer and an Au layer are laminated in this order), and an Ni/Pd/Au layer (i.e., a metal layer in which an Ni layer, a Pd layer, and an Au layer are laminated in this order).

The solder resist layer 22 is the outermost layer on the second side of the interconnect substrate 1, and is formed on the lower surface of the third insulating layer 16 so as to cover the fourth interconnect layer 17. The material and thickness of the solder resist layer 22 may be, for example, substantially the same as those of the solder resist layer 21. The solder resist layer 22 has openings 22x. Part of the lower surface of the pads of the fourth interconnect layer 17 is exposed in the openings 22x. The plane shape of the openings 22x may be, for example, a circle. The pads of the fourth interconnect layer 17 exposed in the openings 22x may be used for electrical connection with a mounting substrate (not illustrated) such as a motherboard. If necessary, the above-described metal layer may be formed, or an anti-oxidation treatment such as an OSP treatment may be performed, on the lower surface of the pads of the fourth interconnect layer 17 exposed in the openings 22x.

As described above, the interconnect substrate 1 is configured such that the first interconnect layer 11 is interposed between the first ground plane 14G and the second ground plane 15G in the vertical direction, with the intervening insulating layers (i.e., the first insulating layer 12 and the second insulating layer 13). That is, the interconnect substrate 1 is configured such that the first ground plane 14G, the first insulating layer 12, the first interconnect layer 11, the second insulating layer 13, and the second ground plane 15G constitute a stripline SL. With this arrangement, the characteristic impedance of the first interconnect layer 11 can be controlled, and electromagnetic waves leaking from the first interconnect layer 11 can be reduced.

The stripline SL is preferably disposed directly below the solder resist layer 21 on which a semiconductor chip is mounted. This arrangement ensures a short interconnect path connecting the semiconductor chip and the first interconnect layer 11. As a result, a semiconductor apparatus made by placing the semiconductor chip on the interconnect substrate 1 will be provided with improved electrical characteristics.

Further, the interconnect substrate 1 is configured such that the first interconnect layer 11 constituting the stripline SL is an embedded interconnect whose side surface and lower surface are covered with the first insulating layer 12. As a result, the adhesion between the first insulating layer 12 and the interconnect patterns 11W or pads 11P constituting the first interconnect layer 11 is improved, as compared with the conventional configuration using a non-embedded interconnect that has only the lower surface thereof in contact with an insulating layer and that has the side surface thereof exposed outside the insulating layer.

In the interconnect substrate 1, the area of the portion of each via interconnect 14V connected to the lower surface of the pads 11P is smaller than the area of the portion of each via interconnect 14V connected to the upper surface of the first signal pads 14A or the first ground pad 14B. The area of the portion of each via interconnect 15V connected to the upper surface of the pads 11P is smaller than the area of the portion of each via interconnect 15V connected to the lower surface of the second signal pads 15A or the second ground pad 15B. As a result, the area of the lower surface of each pad 11P can be made smaller than the area of the upper surface of each first signal pad 14A, and the area of the upper surface of each pad 11P can be made smaller than the area of the lower surface of each second signal pad 15A, thereby making it possible to increase the density of the first interconnect layer 11.

[Method of Making Interconnect Substrate]

In the following, a method of making the interconnect substrate according to the first embodiment will be described. FIGS. 3A to 6B are drawings illustrating a manufacturing process of the interconnect substrate according to the first embodiment. The example of the process illustrated here is directed to the configuration in which a layer structure is formed only on the first side of a support, but may as well be directed to the configuration in which a layer structure is formed on both the first side and the second side of a support. Broken lines C in each drawing indicate positions to be cut when the interconnect substrate is divided into individual pieces. A region located between the adjacent broken lines C in a cross-sectional view is made into a single peace, which constitutes one interconnect substrate.

In the step illustrated in FIG. 3A, a support 300 is prepared. The support 300 is structured, for example, such that a carrier-attached copper foil 304 is laminated on the first side of a core substrate 301. The core substrate 301 is, for example, a resin substrate having a thickness of about 0.7 mm, and may include a reinforcing member such as glass fibers. The carrier-attached copper foil 304 is structured such that a thin foil 304a made of, for example, Cu and having a thickness of about 1.5 to 5 µm is detachably attached to a thick foil (carrier foil) 304b made of, for example, Cu and having a thickness of about 10 to 50 µm via a release layer (not shown). The thick foil 304b is provided as a support to facilitate handling of the thin foil 304a.

It may be noted that the above-described structure of the support 300 is only a non-limiting example. For example, the support 300 may be configured such that a laminate made by sticking together a plurality of prepregs may be used instead of the core substrate 301. Further, the support 300 may be structured such that the carrier-attached copper foil 304 is disposed on the first side of a glass substrate, a metal substrate, or the like via a release layer.

In the step illustrated in FIG. 3B, the first interconnect layer 11 including the interconnect patterns 11W and the pads 11P is formed on the support 300. To be specific, a resist layer having openings at the positions where the first interconnect layer 11 is to be formed is formed on the upper surface of the carrier-attached copper foil 304 (i.e., the upper surface of the thin foil 304a) by using a dry film resist or the like. Then, the first interconnect layer 11 is formed as an electrolytic plating layer on the upper surface of the carrier-attached copper foil 304 exposed in the openings by an electrolytic plating method using the carrier-attached copper foil 304, which is a metal layer, as a power feeding layer. The material and thickness of the first interconnect layer 11 are as described above. Subsequently, the resist layer is removed by peeling.

In the step illustrated in FIG. 3C, the first insulating layer 12 is formed on the support 300 to cover the surface of the first interconnect layer 11 that is not in contact with the support 300. Specifically, the first insulating layer 12 covering the first interconnect layer 11 is formed on the upper surface of the carrier-attached copper foil 304. First, for example, a semi-cured insulating resin film containing a thermosetting resin as a main component is prepared. Then, the insulating resin film is laminated on the upper surface of the carrier-attached copper foil 304, and is cured by application of heat and pressure to form the first insulating layer 12. Alternatively, instead of laminating the insulating resin film, an insulating resin liquid or paste may be applied and then cured to form the first insulating layer 12. The material and the thickness of the first insulating layer 12 are as described above.

In the step illustrated in FIG. 4A, the via holes 12x that extend through the first insulating layer 12 and expose the upper surface of the first interconnect layer 11 are formed in the first insulating layer 12. The via holes 12x may be formed by, for example, a laser processing method using a $CO_2$ laser, a YAG laser, an excimer laser, or the like. After the via holes 12x are formed, a desmear treatment is preferably performed to remove resin residues adhering to the surface of the first interconnect layer 11 exposed at the bottom of the via holes 12x.

In the step illustrated in FIG. 4B, the second interconnect layer 14 is formed on the first insulating layer 12. As was previously described, the second interconnect layer 14 includes the first ground plane 14G, the first signal pads 14A, the first ground pad 14B, and the via interconnects 14V. The material and thickness of the second interconnect layer 14 are as described above. A method of forming the second interconnect layer 14 will be described later in detail.

In the steps illustrated in FIGS. 4C and 5A, the support 300 illustrated in FIG. 4B is removed. In order to remove the support 300, the core substrate 301 and the thick foil 304b are mechanically peeled off from the thin foil 304a as illustrated in FIG. 4C. Then, as illustrated in FIG. 5A, the thin foil 304a is removed by wet etching using, for example, a ferric chloride aqueous solution, a cupric chloride aqueous solution, an ammonium persulfate aqueous solution, or the like.

In the step illustrated in FIG. 5B, the second insulating layer 13 is formed on the first side of the first insulating layer 12 so as to cover the surface of the first interconnect layer 11 that was in contact with the support 300. Further, the third insulating layer 16 is formed on the second side of the first insulating layer 12 so as to cover the second interconnect layer 14. Specifically, for example, two semi-cured insulating resin films containing a thermosetting resin as a main component are prepared. Then, the insulating resin films are laminated on the first surface and the second surface of the first insulating layer 12, and are cured by application of heat and pressure to form the second insulating layer 13 and the third insulating layer 16. Alternatively, instead of laminating the insulating resin films, an insulating resin liquid or paste may be applied and then cured to form the second insulating layer 13 and the third insulating layer 16. The material and thickness of the second insulating layer 13 and the third insulating layer 16 may be, for example, substantially the same as those of the first insulating layer 12. It may be noted that what is illustrated in FIG. 5B is upside down relative to FIG. 5A. The same applies to FIGS. 5 C through 6B described below.

In the step illustrated in FIG. 5C, the via holes 13x that extend through the second insulating layer 13 and expose the upper surface of the first interconnect layer 11 are formed in the second insulating layer 13. Further, the via holes 16x that extend through the third insulating layer 16 and expose the lower surface of the second interconnect layer 14 are formed in the third insulating layer 16. The via holes 13x and 16x may be formed by, for example, a laser processing method using a $CO_2$ laser or the like. After the formation of the via holes 13x and the via holes 16x, a desmear treatment is preferably performed according to need so as to remove resin residues adhering to the surface of the first interconnect layer 11 exposed at the bottom of the via holes 13x and the surface of the second interconnect layer 14 exposed at the bottom of the via holes 16x.

In the step illustrated in FIG. 6A, the third interconnect layer 15 is formed on the second insulating layer 13. The third interconnect layer 15 includes via interconnects 15V filling the via holes 13x, and includes the second ground plane 15G, the second signal pads 15A, and the second ground pad 15B formed on the upper surface of the second insulating layer 13. The second ground plane 15G is formed in a substantially solid shape so as to cover most of the upper surface of the second insulating layer 13. The second signal pads 15A are disposed in the openings 15x provided in the second ground plane 15G. The second ground pad 15B forms part of the second ground plane 15G. The second signal pads 15A and the second ground pad 15B are electrically connected to the pads 11P through the via interconnects 15V. The material of the third interconnect layer 15 and the thickness of the second ground plane 15G, the second signal pads 15A, and the second ground pad 15B may be substantially the same as those of the first interconnect layer 11, for example.

Further, the fourth interconnect layer 17 is formed on the second side of the third insulating layer 16. The fourth interconnect layer 17 includes via interconnects filling the via holes 16x, and includes interconnect patterns and pads formed on the lower surface of the third insulating layer 16. The material of the fourth interconnect layer 17 and the thickness of the interconnect patterns and the pads may be substantially the same as those of the first interconnect layer 11, for example. The fourth interconnect layer 17 is electrically connected to the second interconnect layer 14 exposed at the bottom of the via holes 16x.

In the step illustrated in FIG. 6B, the solder resist layer 21 is formed on the upper surface of the second insulating layer 13 so as to cover the third interconnect layer 15. Further, the solder resist layer 22 is formed on the lower surface of the third insulating layer 16 so as to cover the fourth interconnect layer 17. The solder resist layer 21 may be formed by, for example, a screen-printing method, a roll coating method, a spin coating method, or the like applying a photosensitive epoxy-based insulating resin or acrylic insulating resin in a liquid or paste form to the upper surface of the second insulating layer 13 such as to cover the third interconnect layer 15. Alternatively, a photosensitive epoxy-based insulating resin or acrylic insulating resin in a film form, for example, may be laminated on the upper surface of the second insulating layer 13 such as to cover the third interconnect layer 15. The method of forming the solder resist layer 22 is substantially the same as that of the solder resist layer 21.

The solder resist layers 21 and 22 are exposed to light and developed. The openings 21x are thus formed (by photolithography) in the solder resist layer 21 to expose part of the upper surface of the third interconnect layer 15. Further, the openings 22x are formed (by photolithography) in the solder resist layer 22 to expose part of the lower surface of the fourth interconnect layer 17. The openings 21x and 22x may alternatively be formed by a laser method or a blasting process. In such a case, there is no need to use a photosensitive material for the solder resist layers 21 and 22. The plane shape of each of the openings 21x and 22x may be, for example, a circle. The diameters of the openings 21x and 22x may be selected in accordance with what is connected thereto (e.g., a semiconductor chip, a motherboard, or the like).

In the step described above, the metal layer as previously described may be formed on the upper surface of the third interconnect layer 15 exposed at the bottom of the openings 21x and the lower surface of the fourth interconnect layer 17 exposed at the bottom of the openings 22x by, for example, an electroless plating method or the like. Instead of forming the metal layer, an anti-oxidation treatment such as an OSP treatment may alternatively be performed. After the step illustrated in FIG. 6B, cuts are made along the broken lines C to obtain an individual interconnect substrate 1.

As described above, the method of making the interconnect substrate 1 is configured such that the first interconnect layer 11 constituting the stripline SL is an embedded interconnect whose side surface and lower surface are covered with the first insulating layer 12. In conventional methods for making an interconnect substrate, an embedded interconnect is arranged on the outermost layer of an interconnect substrate, which makes it possible to form a microstrip line, but does not enable the formation of a stripline. In contrast, the method of making the interconnect substrate 1 enables an embedded interconnect to form a stripline because an insulating layer and an interconnect layer are additionally formed after the support is removed to expose the upper surface of the embedded interconnect. This arrangement improves the adhesion between the first insulating layer 12 and the first interconnect layer 11 constituted by the interconnect patterns 11W and the pads 11P, thereby enabling the realization of a highly reliable stripline SL.

Further, as will be described later in <Detail of Method of Making Interconnect Layer>, a step of etching a seed layer by using an electrolytic plating layer as a mask is required when using a semi-additive method or a modified semi-additive method to form an interconnect layer. In this step, the side surface of the electrolytic plating layer is also etched at the time of etching the seed layer, so that the intervals of interconnects in the interconnect layer are widened, which makes it difficult to provide a narrow line width and space. In contrast, the side surface of the first interconnect layer 11, which serve as embedded interconnects, is covered with the first insulating layer 12 in the step of etching and removing the thin foil 304a constituting the support 300, so that the intervals of the interconnects are not widened at the time of etching and removing the thin foil 304a, which enables the provision of a narrow line width and space. For example, the line width and space that can be formed by the semi-additive method or the modified semi-additive method are about 11 to 13 μm and 11 to 13 μm, respectively. In the first interconnect layer 11 serving as embedded interconnects, on the other hand, a line width of about 8 to 10 μm and a space of about 8 to 10 μm can be achieved. That is, the stripline SL in the interconnect substrate 1 can be formed as fine interconnects that are the interconnect patterns 11W having a pitch of 20 μm or less. Further, the miniaturization of interconnects makes it possible to reduce the size of the interconnect substrate 1.

First Variation of First Embodiment

A first variation of the first embodiment is directed to an example of an interconnect substrate having five interconnect layers. In the first variation of the first embodiment, a description of the same components as those of the previously described embodiment may be omitted.

Figure 7:
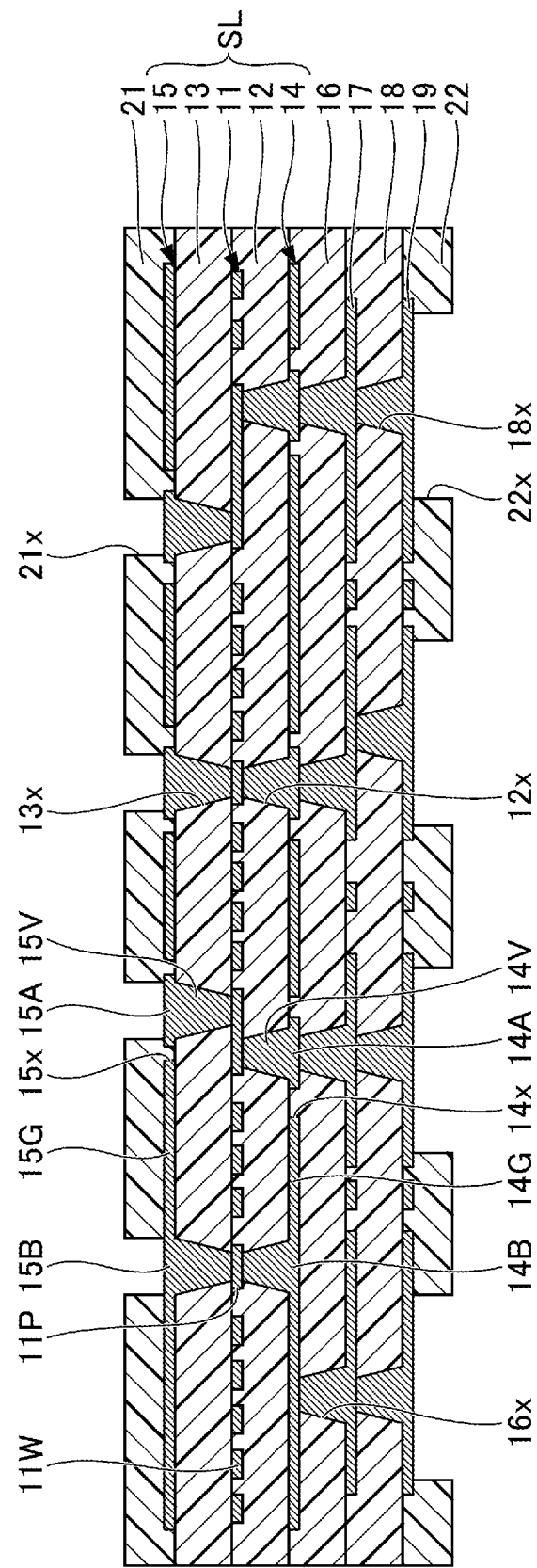
FIG. 7 is a cross-sectional view illustrating an example of an interconnect substrate according to a first variation of the first embodiment.

FIG. 7 is a cross-sectional view illustrating an example of an interconnect substrate according to the first variation of the first embodiment. Referring to FIG. 7, an interconnect substrate 1A includes a fourth insulating layer 18 and a fifth interconnect layer 19 between the fourth interconnect layer 17 and the solder resist layer 22 of the interconnect substrate 1.

The fourth insulating layer 18 is formed on the second surface of the third insulating layer 16 such as to cover the fourth interconnect layer 17. The material and thickness of the fourth insulating layer 18 may be, for example, substantially the same as those of the first insulating layer 12. The fourth insulating layer 18 may contain a filler such as silica ($SiO_2$). The content of the filler in the fourth insulating layer 18 may be, for example, substantially the same as that in the first insulating layer 12.

The fifth interconnect layer 19 is formed on the second side of the fourth insulating layer 18. The fifth interconnect layer 19 includes via interconnects filling via holes 18x extending through the fourth insulating layer 18 and exposing the lower surface of the fourth interconnect layer 17, pads formed on the lower surface of the fourth insulating layer 18, and interconnect patterns. The pads of the fifth interconnect layer 19 are electrically connected to the pads of the fourth interconnect layer 17 through the via interconnects. The via holes 18x may be a truncated cone-shaped recess, with the size of the opening thereof on the solder resist layer 22 side being larger than the size of the bottom surface thereof formed by the lower surface of the pads constituting the fourth interconnect layer 17. The material and the thickness of the interconnect patterns of the fifth interconnect layer 19 may be substantially the same as those of the first interconnect layer 11, for example.

The solder resist layer 22 is the outermost layer on the second side of the interconnect substrate 1A, and is formed on the lower surface of the fourth insulating layer 18 such as to cover the fifth interconnect layer 19. The solder resist layer 22 has the openings 22x, and part of the lower surface of the pads of the fifth interconnect layer 19 is exposed in the openings 22x. The plane shape of the openings 22x may be, for example, a circle. The pads of the fifth interconnect layer 19 exposed in the openings 22x may be used for electrical connection to a mounting substrate (not illustrated) such as a motherboard. According to need, the metal layer as previously described may be formed, or an anti-oxidation treatment such as an OSP treatment may be performed, on the lower surface of the pads of the fifth interconnect layer 19 exposed in the openings 22x.

Figure 8A:
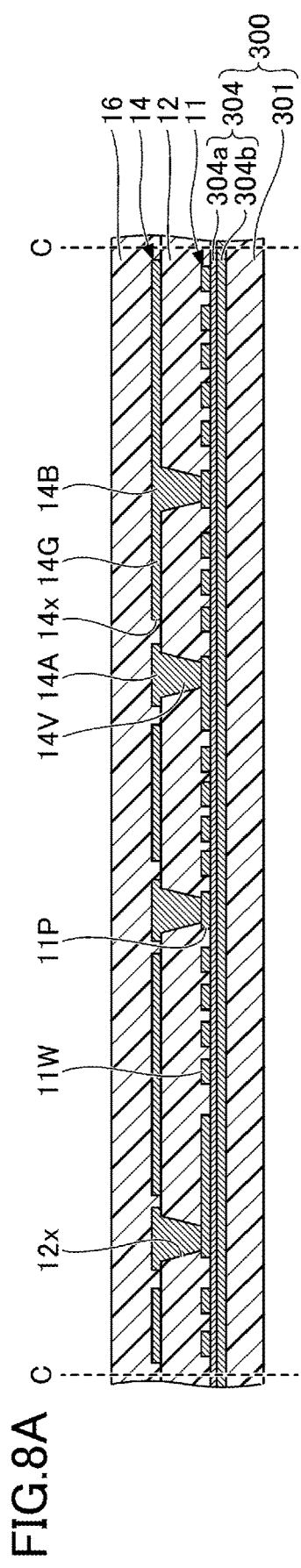
FIGS. 8A through 8C are drawings illustrating an example of a method of making the interconnect substrate of the first variation of the first embodiment.
Figure 8B:
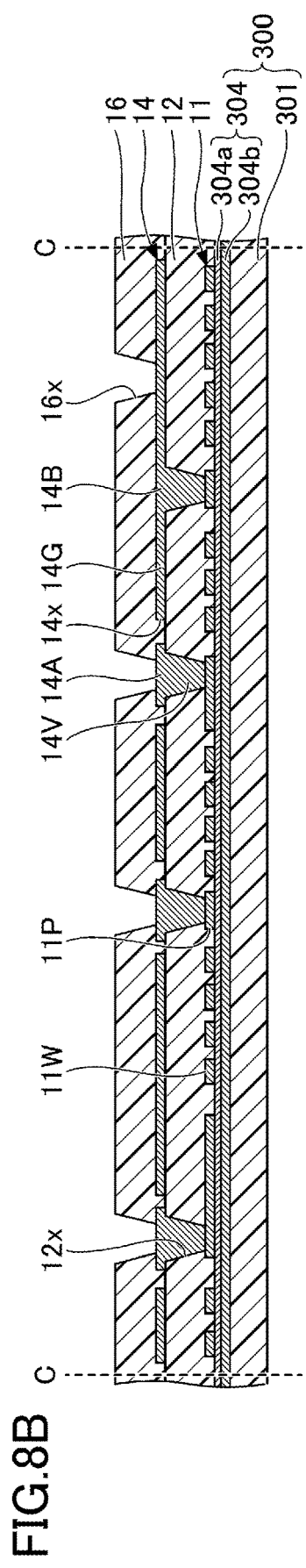

In order to manufacture the interconnect substrate 1A, after the step of FIG. 4B of the first embodiment, the third insulating layer 16 is formed on the first side of the first insulating layer 12 as illustrated in FIG. 8A in the same manner as in the step illustrated in FIG. 5B. Thereafter, in the step illustrated in FIG. 8B, the via holes 16x are formed in the third insulating layer 16 such as to extend through the third insulating layer 16 and expose the upper surface of the second interconnect layer 14 similarly to the step illustrated in FIG. 5C. After the via holes 16x are formed, a desmear treatment is preferably performed according to need so as to remove resin residues adhering to the surface of the second interconnect layer 14 exposed at the bottom of the via holes 16x. In the step illustrated in FIG. 8C, the fourth interconnect layer 17 is formed on the first side of the third insulating layer 16 in the same manner as in the step illustrated in FIG. 6A.

Figure 8C:
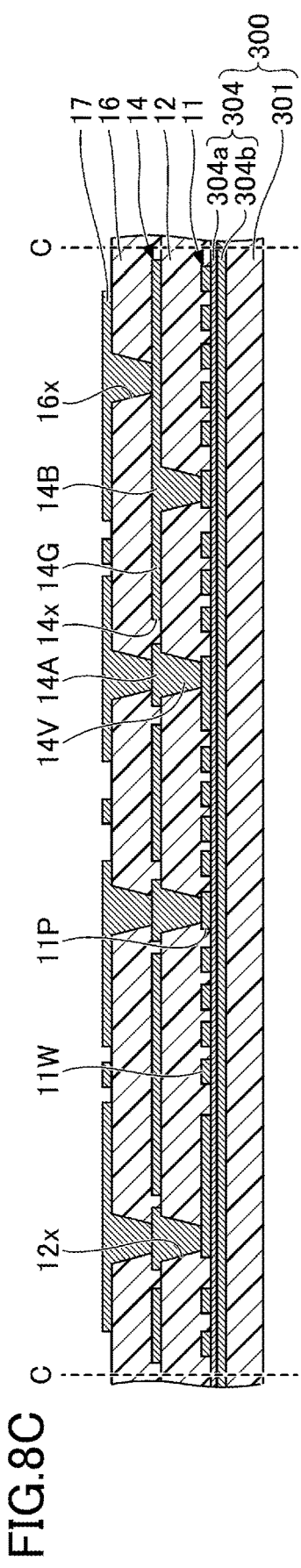
Figure 9A:
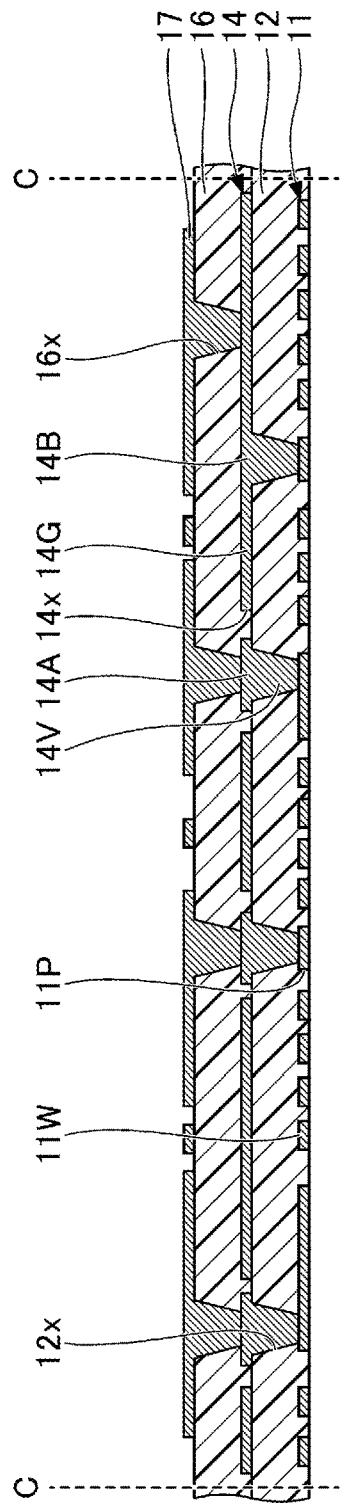
FIGS. 9A and 9B are drawings illustrating the example of the method of making the interconnect substrate of the first variation of the first embodiment.
Figure 9B:
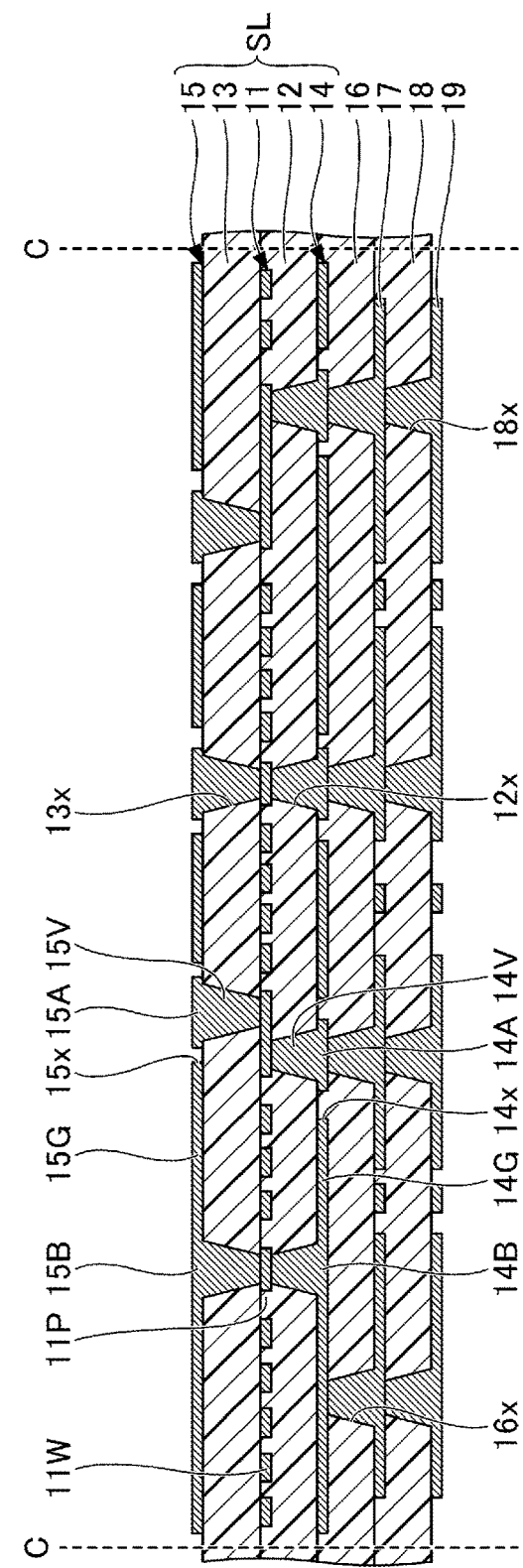

In the step illustrated in FIG. 9A, the support 300 illustrated in FIG. 8C is removed in the same manner as in the steps illustrated in FIGS. 4C and 5A. In the step illustrated in FIG. 9B, similarly to the step illustrated in FIG. 5B, the second insulating layer 13 is formed on the first side of the first insulating layer 12 such as to cover the surface of the first interconnect layer 11 that was in contact with the support 300, and, then, the third interconnect layer 15 is further formed. Moreover, the fourth insulating layer 18 is formed on the second side of the third insulating layer 16 such as to cover the fourth interconnect layer 17, and, then, the fifth interconnect layer 19 is further formed. Thereafter, a step similar to that illustrated in FIG. 6B is performed to complete the interconnect substrate 1A. It should be noted that what is illustrated in FIG. 9B is upside down relative to FIG. 9A.

As described above, an interconnect substrate having the stripline SL is not limited to a structure having four interconnect layers such as the interconnect substrate 1. For example, a structure having five interconnect layers such as the interconnect substrate 1A will suffice. As long as there are three or more interconnect layers, a structure having a different number of interconnect layers than four or five layers will also suffice.

<Detail of Method of Forming Interconnect Layer>

FIGS. 10A through 10C and FIGS. 11A and 11B are drawings illustrating an example of a detailed method of forming an interconnect layer. The following description will be directed to an example in which the second interconnect layer 14 is formed by a semi-additive method.

After the step illustrated in FIG. 4A of the first embodiment, in the step illustrated in FIG. 10A, a seed layer 14s is formed on the surface of the first insulating layer 12 including the inner walls of the via holes 12x and the surface of the first interconnect layer 11 exposed in the via holes 12x. The seed layer 14s may be formed of, for example, copper or the like by electroless plating or sputtering.

In the step illustrated in FIG. 10B, a resist layer 400 is formed on the seed layer 14s using a photosensitive dry film resist or the like. The resist layer 400 is then exposed to light and developed to form openings 400x whose shape matches with the shape of the second interconnect layer 14. The seed layer 14s is exposed in the openings 400x.

In the step illustrated in FIG. 10C, an electrolytic plating layer 14p is deposited on the seed layer 14s exposed in the openings 400x of the resist layer 400 by electrolytic plating in which power is supplied through the seed layer 14s. Copper or the like may be used as the material of the electrolytic plating layer 14p. In the step illustrated in FIG. 11A, the resist layer 400 is removed.

Figure 11A:
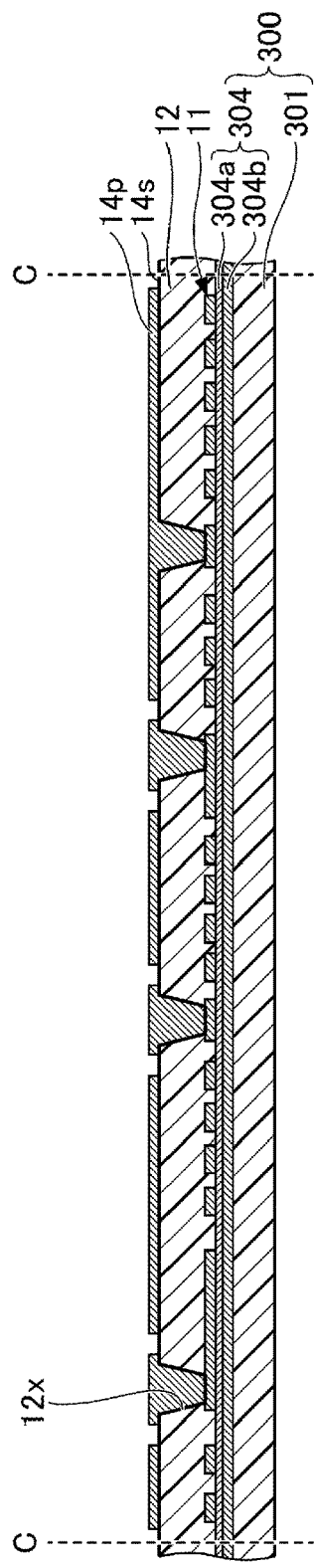
FIGS. 11A and 11B are drawings illustrating the example of the detailed method of forming an interconnect layer.
Figure 11B:
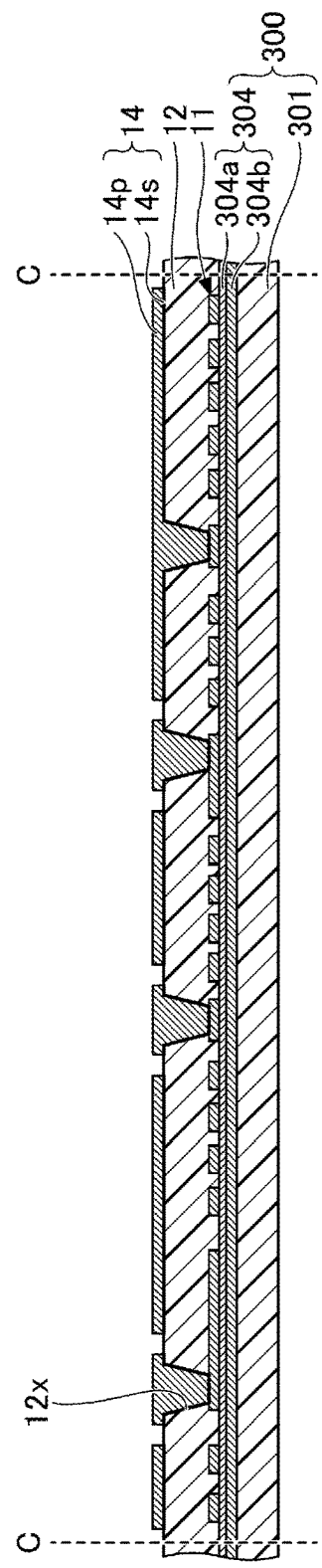

In the step illustrated in FIG. 11B, etching is performed using the electrolytic plating layer 14p as a mask to remove the seed layer 14s exposed through the electrolytic plating layer 14p, thereby obtaining the second interconnect layer 14 including the seed layer 14s and the electrolytic plating layer 14p. As illustrated in FIG. 1, the structure of the second interconnect layer 14 includes the first ground plane 14G, the first signal pads 14A, the first ground pad 14B, and the via interconnects 14V. In the case of the seed layer 14s being formed of Cu, the seed layer 14s may be removed by wet etching using, for example, a ferric chloride aqueous solution, a cupric chloride aqueous solution, an ammonium persulfate aqueous solution, or the like. At this time, the upper surface and side surface of the electrolytic plating layer 14p are also slightly removed.

FIGS. 12A through 14B are drawings illustrating another example of a detailed method of forming the interconnect layer. The following description will be directed to an example in which the second interconnect layer 14 is formed by a modified semi-additive method.

In the step illustrated in FIG. 12A, the first interconnect layer 11 is formed on the support 300 in substantially the same manner as illustrated in FIGS. 3A and 3B of the first embodiment. In the step illustrated in FIG. 12B, the first insulating layer 12 in a semi-cured state is formed on the upper surface of the carrier-attached copper foil 304 such as to cover the first interconnect layer 11, and a metal foil 14*m* is disposed on the upper surface of the first insulating layer 12, followed by curing the first insulating layer 12, in substantially the same manner as illustrated in the step illustrated in FIG. 3C. The first insulating layer 12 is preferably cured by heat while pressing the metal foil 14*m* against the first insulating layer 12. This arrangement ensures the adhesion strength between the metal foil 14*m* and the first insulating layer 12, thereby preventing the metal foil 14*m* from detaching from the first insulating layer 12. Cu or a Cu alloy, for example, may be used as the material of the metal foil 14*m*. The metal foil 14*m* may be, for example, about 5 to 10 µm in thickness.

In the step illustrated in FIG. 12C, the first insulating layer 12 is irradiated with a laser beam through the metal foil 14*m* to form the via holes 12*x* that extend through the metal foil 14*m* and the first insulating layer 12 and that expose the upper surface of the first interconnect layer 11. The via holes 12*x* may be formed by, for example, a laser processing method using a $CO_2$ laser, a YAG laser, an excimer laser, or the like. After the via holes 12*x* are formed, a desmear treatment is preferably performed to remove resin residues adhering to the surface of the first interconnect layer 11 exposed at the bottom of the via holes 12*x*.

In the step illustrated in FIG. 13A, a seed layer 14*s* is formed on the surface of the metal foil 14*m*, the surface of the first insulating layer 12 constituting the inner walls of the via holes 12*x*, and the surface of the first interconnect layer 11 exposed in the via holes 12*x*. The seed layer 14*s* may be formed of, for example, copper or the like by electroless plating or sputtering.

In the step illustrated in FIG. 13B, a resist layer 410 is formed on the seed layer 14*s* by use of a photosensitive dry resist film or the like. The resist layer 410 is then exposed to light and developed to form openings 410*x* whose shape matches with the shape of the second interconnect layer 14. The seed layer 14*s* is exposed in the openings 410*x*.

In the step illustrated in FIG. 14A, an electrolytic plating layer 14*p* is deposited on the seed layer 14*s* exposed in the openings 410*x* of the resist layer 410 by electrolytic plating in which power is supplied through the metal foil 14*m* and the seed layer 14*s*. Copper or the like, for example, may be used as the material of the electrolytic plating layer 14*p*.

In the step illustrated in FIG. 14B, after the resist layer 410 illustrated in FIG. 14A is removed, etching is performed using the electrolytic plating layer 14*p* as a mask to remove the metal foil 14*m* and the seed layer 14*s* exposed through the electrolytic plating layer 14*p*, thereby obtaining the second interconnect layer 14 including the metal foil 14*m*, the seed layer 14*s*, and the electrolytic plating layer 14*p*. As illustrated in FIG. 1, the structure of the second interconnect layer 14 includes the first ground plane 14G, the first signal pads 14A, the first ground pad 14B, and the via interconnects 14V. In the case of the metal foil 14*m* and the seed layer 14*s* being made of copper, the metal foil 14*m* and the seed layer 14*s* may be removed by wet etching using, for example, a ferric chloride aqueous solution, a cupric chloride aqueous solution, an ammonium persulfate aqueous solution, or the like. At this time, the upper surface and side surface of the electrolytic plating layer 14*p* are also slightly removed.

As described above, an interconnect layer may be formed by a semi-additive method or a modified semi-additive method.

In the modified semi-additive method, a metal foil is laminated on an insulating layer, and a seed layer is formed on a surface of the metal foil. Metal foils having various surface roughness are available, and a metal foil having a small surface roughness can be selected. Use of a metal foil having a small surface roughness enables the formation of an interconnect layer having small surface irregularities suitable for radio-frequency transmission. It may be noted that the interconnect layer includes interconnect patterns, pads, and a ground plane.

In contrast, the semi-additive method is such that a seed layer is directly formed on the surface of an insulating layer. That is, the semi-additive method does not require a step of laminating a metal foil on an insulating layer, which serves to simplify the interconnect substrate manufacturing process. However, since the surface of an insulating layer often has a larger surface roughness than the surface of a metal foil, use of an insulating layer having a large surface roughness ends up providing an interconnect layer having relatively large surface irregularities. Even in the semi-additive method, an insulating layer having a small surface roughness may be selected for use, which enables the formation of an interconnect layer having small surface irregularities suitable for radio-frequency transmission.

Example of Practical Application of First Embodiment

An example of practical application of the first embodiment, which will be described below, is directed to a semiconductor apparatus in which a semiconductor chip is mounted on an interconnect substrate. In this example of practical application of the first embodiment, a description of the same components as those of the previously described embodiment may be omitted.

Figure 15:
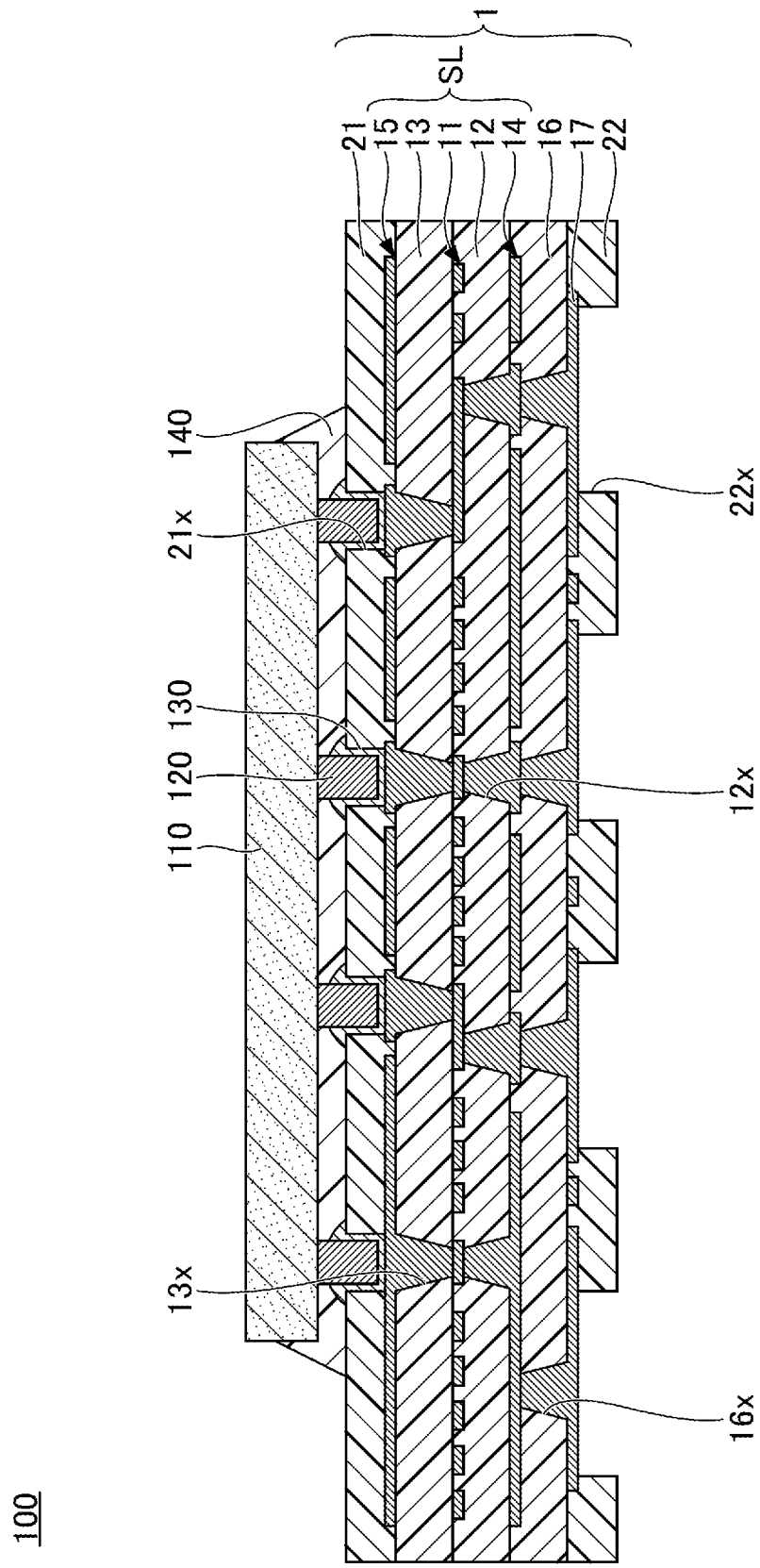
FIG. 15 is a cross-sectional view illustrating an example of a semiconductor apparatus according to an example of practical application of the first embodiment.

FIG. 15 is a cross-sectional view illustrating an example of a semiconductor apparatus according to the example of practical application of the first embodiment. Referring to FIG. 15, a semiconductor apparatus 100 includes the interconnect substrate 1 illustrated in FIG. 1, a semiconductor chip 110, electrode posts 120, bumps 130, and an underfill resin 140.

In the semiconductor chip 110, a semiconductor integrated circuit (not shown) or the like is formed on a thin semiconductor substrate (not shown) made of silicon or the like, for example. The electrode posts 120 electrically connected to the semiconductor integrated circuit (not shown) are formed on the semiconductor substrate (not shown).

The bumps 130 are formed between the electrode posts 120 of the semiconductor chip 110 and the pads of the third interconnect layer 15 of the interconnect substrate 1. Each of the bumps 130 covers, and electrically connects, the lower surface and at least part of the side surface of a corresponding one of the electrode posts 120 and the upper surface of a corresponding one of the pads belonging to the third interconnect layer 15 of the interconnect substrate 1. The electrode posts 120 are copper posts, for example. The bumps 130 are solder bumps, for example. The material of the solder bumps may be, for example, an alloy containing Pb, an alloy of Sn and Cu, an alloy of Sn and Ag, an alloy of Sn, Ag, and Cu, or the like. The underfill resin 140 fills the gap between the semiconductor chip 110 and the upper surface of the interconnect substrate 1.

Figure 16:
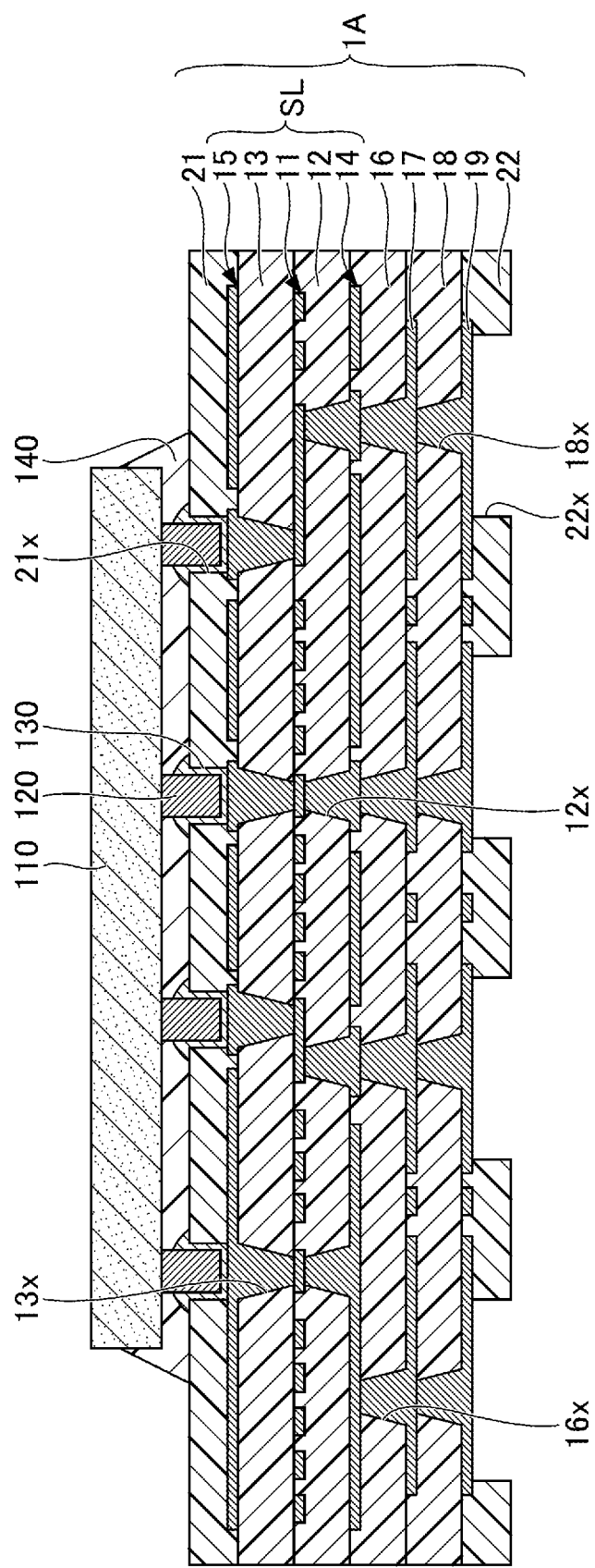
FIG. 16 is a cross-sectional view illustrating another example of the semiconductor apparatus according to an example of practical application of the first embodiment.

In the manner described above, a semiconductor chip is mounted on the interconnect substrate of the first embodiment to provide a semiconductor apparatus. As in the case of a semiconductor apparatus 100A illustrated in FIG. 16, the interconnect substrate 1A may be used in place of the interconnect substrate 1. In any of these semiconductor apparatuses, the stripline SL is provided in the interconnect substrate, which serves to control the characteristic impedance of the first interconnect layer 11 and to reduce electromagnetic waves leaking from the first interconnect layer 11, thereby enabling high-speed signal transmission.

According to at least one embodiment, adhesion between an interconnect pattern constituting a stripline and insulating layers is improved in an interconnect substrate having the stripline.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

One aspect of the subject-matter described herein is set out non-exclusively in the following numbered clauses.

[Clause 1] A method of making an interconnect substrate, comprising:
forming a first interconnect layer on a support;
forming on the support a first insulating layer covering a surface of the first interconnect layer, the surface being not in contact with the support;
forming a second interconnect layer on the first insulating layer;
removing the support;
forming a second insulating layer covering a surface of the first interconnect layer that was in contact with the support; and
forming a third interconnect layer on the second insulating layer,
wherein the second interconnect layer includes a first ground plane,
wherein the third interconnect layer includes a second ground plane, and
wherein the first ground plane, the first insulating layer, the first interconnect layer, the second insulating layer, and the second ground plane constitute a stripline.

[Clause 2] The method of making an interconnect substrate as recited in clause 1, wherein the forming the first interconnect layer on the support includes:
forming a resist layer having openings on an outermost metal layer of the support;
forming the first interconnect layer in the openings by electrolytic plating using the metal layer as a power feeding layer; and
removing the resist layer.

What is claimed is:

1. An interconnect substrate, comprising:
a first interconnect layer;
a first insulating layer covering a side surface and a lower surface of the first interconnect layer;
a second insulating layer disposed on the first insulating layer and covering an upper surface of the first interconnect layer;
a second interconnect layer formed on a lower surface of the first insulating layer;
a third interconnect layer formed on an upper surface of the second insulating layer; and
a solder resist layer disposed on the second insulating layer and covering the third interconnect layer, an upper surface of the solder resist layer includes a chip mounting area where a semiconductor chip is to be mounted,
wherein the second interconnect layer includes a first ground plane, a first signal pad disposed in an opening provided in the first ground plane, and a first ground pad forming a portion of the first ground plane, and the first signal pad and the opening are each circular and concentric with each other,
wherein the third interconnect layer includes a second ground plane, a second signal pad disposed in an opening provided in the second ground plane, and a second ground pad forming a portion of the second ground plane, and the second signal pad and the opening provided in the second ground plane are each circular and concentric with each other,
wherein the first ground plane, the first insulating layer, an interconnect line of the first interconnect layer, the second insulating layer, and the second ground plane constitute a stripline, and a side surface of the interconnect line is covered with the first insulating layer,
wherein a side surface of the first ground plane is not covered with the first insulating layer, and a side surface of the second ground plane is not covered with the second insulating layer,
wherein the first interconnect layer includes:
interconnect lines;
a first pad electrically connected to the first signal pad through a first via interconnect extending through the first insulating layer;
a second pad electrically connected to the first ground pad through a second via interconnect extending through the first insulating layer;
a third pad electrically connected to the second signal pad through a third via interconnect extending through the second insulating layer; and
a fourth pad electrically connected to the second ground pad through a fourth via interconnect extending through the second insulating layer, a diameter of the first pad and a diameter of the second pad being smaller than a diameter of the first signal pad, a diameter of the third pad and a diameter of the fourth pad being smaller than a diameter of the second signal pad,
wherein the solder resist layer has a first opening exposing an upper surface of the second signal pad and a second opening exposing an upper surface of the second ground pad, the first opening and the second opening being located within the chip mounting area, and
wherein each of the first ground plane and the second ground plane is located under an entirety of the chip mounting area, except for openings provided therein, and the interconnect line that is part of the stripline is located under the chip mounting area, a terminal part of the interconnect line being the third pad electrically connected to the second signal pad.

2. The interconnect substrate as claimed in claim 1, wherein each of the first and second via interconnects extending through the first insulating layer has a first area in contact with a lower surface of a corresponding one of the first and second pads, and has a second area in contact with an upper surface of a corresponding one of the first signal pad and the first ground pad, the first area being smaller than the second area, and wherein each of the third and fourth via interconnects extending through the second insulating layer has a third area in contact with an upper surface of a corresponding one of the third and fourth pads, and has a fourth area in contact with a lower surface of a corresponding one of the second signal pad and the second ground pad, the third area being smaller than the fourth area.

3. A semiconductor apparatus comprising:

the interconnect substrate of claim 1; and a semiconductor chip mounted on the chip mounting area.

4. The interconnect substrate as claimed in claim 1, wherein the diameter of the first pad and the diameter of the third pad are each smaller than the diameter of the first signal pad and the diameter of the second signal pad.

5. The interconnect substrate as claimed in claim 4, wherein the second signal pad and the second ground pad serve as pads for electrical connection with the semiconductor chip.

6. The interconnect substrate as claimed in claim 1, wherein a minimum interval between adjacent interconnect lines in the first interconnect layer is narrower than a minimum interval between adjacent interconnect lines in the second interconnect layer, and is narrower than a minimum interval between adjacent interconnect lines in the third interconnect layer.

7. The interconnect substrate as claimed in claim 1, wherein the second interconnect layer includes a third signal pad disposed in an opening disposed in the first ground plane, the third signal pad being located next to the first signal pad, the opening of the first signal pad being separate from the opening of the third signal pad.

8. The interconnect substrate as claimed in claim 1, wherein the third interconnect layer includes a third signal pad disposed in an opening disposed in the second ground plane, the second signal pad and the third signal pad being separated by the second ground plane such that the second signal pad and the third signal pad are separate and distinct from each other.

* * * * *